(12) United States Patent
Yoon et al.

(10) Patent No.: US 12,550,658 B2
(45) Date of Patent: Feb. 10, 2026

(54) SUBSTRATE PROCESSING APPARATUS AND SUBSTRATE PROCESSING METHOD

(71) Applicant: SEMES CO., LTD., Cheonan-si (KR)

(72) Inventors: Do Hyeon Yoon, Cheonan-si (KR); Eun Seok Kim, Cheonan-si (KR); Mi So Park, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 110 days.

(21) Appl. No.: 18/406,880

(22) Filed: Jan. 8, 2024

(65) Prior Publication Data

US 2024/0234171 A1  Jul. 11, 2024

(30) Foreign Application Priority Data

Jan. 11, 2023  (KR) .................. 10-2023-0003938

(51) Int. Cl.
*H01L 21/67* (2006.01)
(52) U.S. Cl.
CPC .............................. *H01L 21/67028* (2013.01)
(58) Field of Classification Search
CPC ......... H01L 21/67028; H01L 21/67034; H01L 21/6704; H01L 21/67115
See application file for complete search history.

(56) References Cited

U.S. PATENT DOCUMENTS

| | | | |
|---|---|---|---|
| 2,945,313 A * | 7/1960 | Hardesty .................. | G09F 13/18 345/697 |
| 8,083,066 B2 * | 12/2011 | Bourely .................... | B07C 5/34 209/939 |
| 8,184,214 B2 * | 5/2012 | Abe ........................ | H04N 9/315 349/5 |
| 8,753,782 B2 * | 6/2014 | Ishikawa ............ | B60H 1/00885 429/434 |
| 2005/0018302 A1 * | 1/2005 | Yano ....................... | G02B 5/283 359/359 |
| 2020/0155718 A1 * | 5/2020 | Yamaha ................. | H05B 45/12 |
| 2020/0388484 A1 * | 12/2020 | Cho .................. | H01L 21/67115 |
| 2021/0107780 A1 * | 4/2021 | Hayakawa .......... | B29C 49/4273 |

FOREIGN PATENT DOCUMENTS

| | | | | |
|---|---|---|---|---|
| EP | | 0553967 A1 * | 8/1993 | ....... H01L 21/67028 |
| KR | 10-2012-0119781 A | | 10/2012 | |
| KR | 10-2020-0141346 A | | 12/2020 | |
| KR | | 102433558 B1 | 8/2022 | |
| KR | 10-2023-0102704 A | | 7/2023 | |

OTHER PUBLICATIONS

KR 100408104—translation (Year: 2004).*

\* cited by examiner

*Primary Examiner* — Michael E Barr
(74) *Attorney, Agent, or Firm* — HARNESS, DICKEY & PIERCE, P.L.C.

(57) ABSTRACT

Provided is an apparatus for processing a substrate, the apparatus including: a liquid treatment chamber; a drying chamber; and a light treatment chamber, in which the light treatment chamber includes: a treatment housing having a treatment space in which the substrate is processed; a support member for supporting the substrate in the treatment space; a light source for irradiating the substrate supported on the support member with light in the form of pulses; and a light filter for selecting a set range of wavelengths of the light generated by the light source and allowing the selected wavelengths to pass through.

12 Claims, 17 Drawing Sheets

SUBSTRATE PROCESSING APPARATUS AND SUBSTRATE PROCESSING METHOD

CROSS-REFERENCE TO RELATED APPLICATIONS

This application claims priority to and the benefit of Korean Patent Application No. 10-2023-0003938 filed in the Korean Intellectual Property Office on Jan. 11, 2023 the entire contents of which are incorporated herein by reference.

TECHNICAL FIELD

The present invention relates to a substrate processing apparatus and a substrate processing method.

BACKGROUND ART

Semiconductor processing includes cleaning processes to remove thin films, foreign substances, particles, and the like, from substrates, such as wafers. These processes are accomplished by placing a substrate on a spin head with a patterned side facing up or down, supplying a treatment liquid to the substrate while the spin head is rotated, and subsequently drying the wafer.

More recently, supercritical fluids have been used in substrate cleaning processes. According to the example, a substrate treatment device is provided with a liquid treatment chamber for performing liquid treatment on a substrate by supplying a treatment liquid to the substrate, and a drying chamber for removing the treatment liquid from the substrate using a supercritical fluid after the liquid treatment, and the substrate that has been treated in the liquid treatment chamber is loaded into to the drying chamber by a transfer robot.

The liquid treatment chamber(s) supplies a rinse liquid, such as pure water, to the substrate and then supplies an organic solvent, such as isopropyl alcohol, to substitute the supplied rinse liquid with the substrate. The substrate is then loaded into the drying chamber while having a liquid film formed by the organic solvent. The drying chamber removes the residual rinse liquid and/or organic solvent on the substrate by using a supercritical carbon dioxide fluid.

Organic matter may remain on the substrate on which the liquid treatment in the liquid treatment chamber and the drying treatment in the drying chamber had been performed. Residual organic matter on the substrate may cause failures in a semiconductor device manufactured by the substrate.

SUMMARY OF THE INVENTION

The present invention has been made in an effort to provide a substrate processing apparatus and a substrate processing method that may efficiently remove organic matter residual on a substrate by irradiating the substrate with light.

The present invention has also been made in an effort to provide a substrate processing apparatus and a substrate processing method that may minimize the occurrence of a warpage phenomenon or a broken phenomenon of a substrate when treating a substrate by irradiating the substrate with light, while maintaining high efficiency of removal of organic matters residual on the substrate.

The present invention has also been made in an effort to provide a substrate processing apparatus and a substrate processing method that may select a wavelength of light transmitted to a substrate according to a type of organic matter residual on the substrate.

The object of the present invention is not limited thereto, and other objects not mentioned will be clearly understood by those of ordinary skill in the art from the following description.

An exemplary embodiment of the present invention provides an apparatus for processing a substrate, the apparatus including: a liquid treatment chamber for liquid-treating a substrate by supplying a treatment liquid to the substrate; a drying chamber for drying-treating the substrate treated in the liquid treatment chamber; and a light treatment chamber for irradiating the substrate treated in the drying chamber with light to remove an organic matter residual on the substrate, in which the light treatment chamber includes: a treatment housing having a treatment space in which the substrate is processed; a support member for supporting the substrate in the treatment space; a light source for irradiating the substrate supported on the support member with light in the form of pulses; and a light filter for selecting a set range of wavelengths of the light generated by the light source and allowing the selected wavelengths to pass through.

According to the exemplary embodiment, the light filter may be configured to filter wavelengths, other than wavelengths of a visible light range, in the wavelengths of the light generated by the light source.

According to the exemplary embodiment, the light filter may have a tube shape surrounding the light source.

According to the exemplary embodiment, the light filter may be formed from a material including quartz, and a film that filters wavelengths other than the wavelengths of the visible light range is attached to a surface of the light filter, or a coating layer is formed on a surface of the light filter.

According to the exemplary embodiment, the light treatment chamber may include: a light source housing that defines a space in which the light source is placed, and the light filter is disposed between the light source housing and the treatment housing, and the light filter may have a plate shape to compartmentalize the treatment space of the treatment housing and the space of the light source housing from each other, and a film that filters the wavelengths other than the wavelengths of the visible light range may be attached to a surface of the light filter or a coating layer may be formed on a surface of the light filter.

According to the exemplary embodiment, the light filter may be configured to filter wavelengths in the range of 350 to 700 nm in the wavelengths of the light generated by the light source.

According to the exemplary embodiment, the light source may be a xenon flash lamp, and generate light having wavelengths in the range of 300 to 1000 nm.

According to the exemplary embodiment, the apparatus may further include a light source controller for controlling an operation of the light source, in which the light source controller may be configured to control at least one of an output of the light generated by the light source, a duty ratio in a unit pulse of light, and a period of the unit pulse of light.

According to the exemplary embodiment, the light source controller may control the light source such that an output of the unit pulse of the light generated by the light source in an on state or a high state is constant during light treatment of the substrate supported on the support member.

According to the exemplary embodiment, the light source controller may control the light source such that an output of the unit pulse of the light generated by the light source in an on state or a high state becomes gradually smaller during light treatment of the substrate supported on the support member.

According to the exemplary embodiment, the light source controller may control the light source such that the duty ratio of the unit pulse of the light generated by the light source varies during light treatment of the substrate supported on the support member.

According to the exemplary embodiment, the light source controller may control the light source such that the duty ratio of the unit pulse of the light generated by the light source becomes gradually smaller during light treatment of the substrate supported on the support member.

Another exemplary embodiment of the present invention provides a method of processing a substrate, the method including: a liquid treatment operation of liquid-treating a substrate by supplying a treatment liquid to the substrate; a drying operation of drying-treating the substrate by supplying a supercritical fluid to the liquid-treated substrate; and a light treatment operation of irradiating the drying-treated substrate with light to remove an organic matter residual on the substrate, in which in the light treatment operation, the light is generated in the form of pulses, but a set range of wavelengths of the light is selected by a light filter to be emitted to the substrate.

According to the exemplary embodiment, the light treatment operation may include selecting wavelengths in the visible light range in the wavelengths of the light and emitting the selected wavelengths to the substrate.

According to the exemplary embodiment, the light treatment operation may include selecting wavelengths in the range of 350 to 700 nm in the wavelengths of the light and emitting the selected wavelengths to the substrate.

According to the exemplary embodiment, the light may have wavelengths in the range of 300 to 1000 nm and is generated by a xenon flash lamp.

According to the exemplary embodiment, in the light treatment operation, a duty ratio of a unit pulse of the light may become smaller, or an output of a unit pulse of the light in an on state or a high state may become gradually smaller.

According to the exemplary embodiment, the light filter may include a plurality of light filters, and configured to selectively allows a different range of wavelengths to pass through, and a wavelength range of the light emitted to the substrate may be selected by using any one of the light filters, depending on the type of organic matter residual on the substrate.

Still another exemplary embodiment of the present invention provides an apparatus for processing a substrate, the apparatus including: a liquid treatment chamber for liquid-treating a substrate by supplying an organic solvent to the substrate; a drying chamber for drying the substrate by supplying a supercritical fluid to the substrate treated in the liquid treatment chamber; and a light treatment chamber for irradiating the substrate treated in the drying chamber with light to remove an organic matter residual on the substrate, in which the light treatment chamber includes: a treatment housing having a treatment space in which the substrate is processed; a support member for supporting the substrate in the treatment space; and a light irradiation unit located on an upper side of the treatment housing and for irradiating the substrate supported on the support member with light, and the light irradiation unit includes: a xenon flash lamp for irradiating the substrate supported on the support member with light in the form of pulses, in which the xenon flash lamp is configured to generate light having wavelengths in the range of 300 to 1000 nm; a light source housing providing a space in which the xenon flash lamp is installed; a light filter configured to select wavelengths in the visible light range in the wavelengths of the light generated by the xenon flash lamp and allows the selected wavelengths to pass through; a reflective member installed on a top side of the xenon flash lamp, and for reflecting light generated by the xenon flash lamp toward the substrate; a middle plate disposed between the light source housing and the treatment housing, and having a middle plate refrigerant flow path formed therein; and a refrigerant supply unit for supplying the refrigerant, and the refrigerant supply unit includes: a refrigerant supply source for supplying a refrigerant; a first supply line for supplying the refrigerant from the refrigerant supply source to a reflective member refrigerant flow path formed in the reflective member; and a first delivery line for delivering the refrigerant from the reflective member refrigerant flow path to the middle plate refrigerant flow path.

According to the exemplary embodiment, the light irradiation unit may further include a light source tube in a shape of a tube surrounding the xenon flash lamp, a light source tube refrigerant flow path may be formed within the light source tube, and the refrigerant supply unit may include: a second supply line for supplying the refrigerant from the refrigerant supply source to the light source tube refrigerant flow path; and a third delivery line for delivering the refrigerant from the light source tube refrigerant flow path to a cooling plate refrigerant flow path of a cooling plate, in which the cooling plate is included in the treatment housing and located on a lower side of the support member.

According to the exemplary embodiment of the present invention, when a substrate is irradiated with light to remove residual organic matter on the substrate, the particles generated by the photodecomposition may be smoothly removed from the substrate.

The effect of the present invention is not limited to the foregoing effects, and those skilled in the art may clearly understand non-mentioned effects from the present specification and the accompanying drawings.

DETAILED DESCRIPTION

Figure 1:
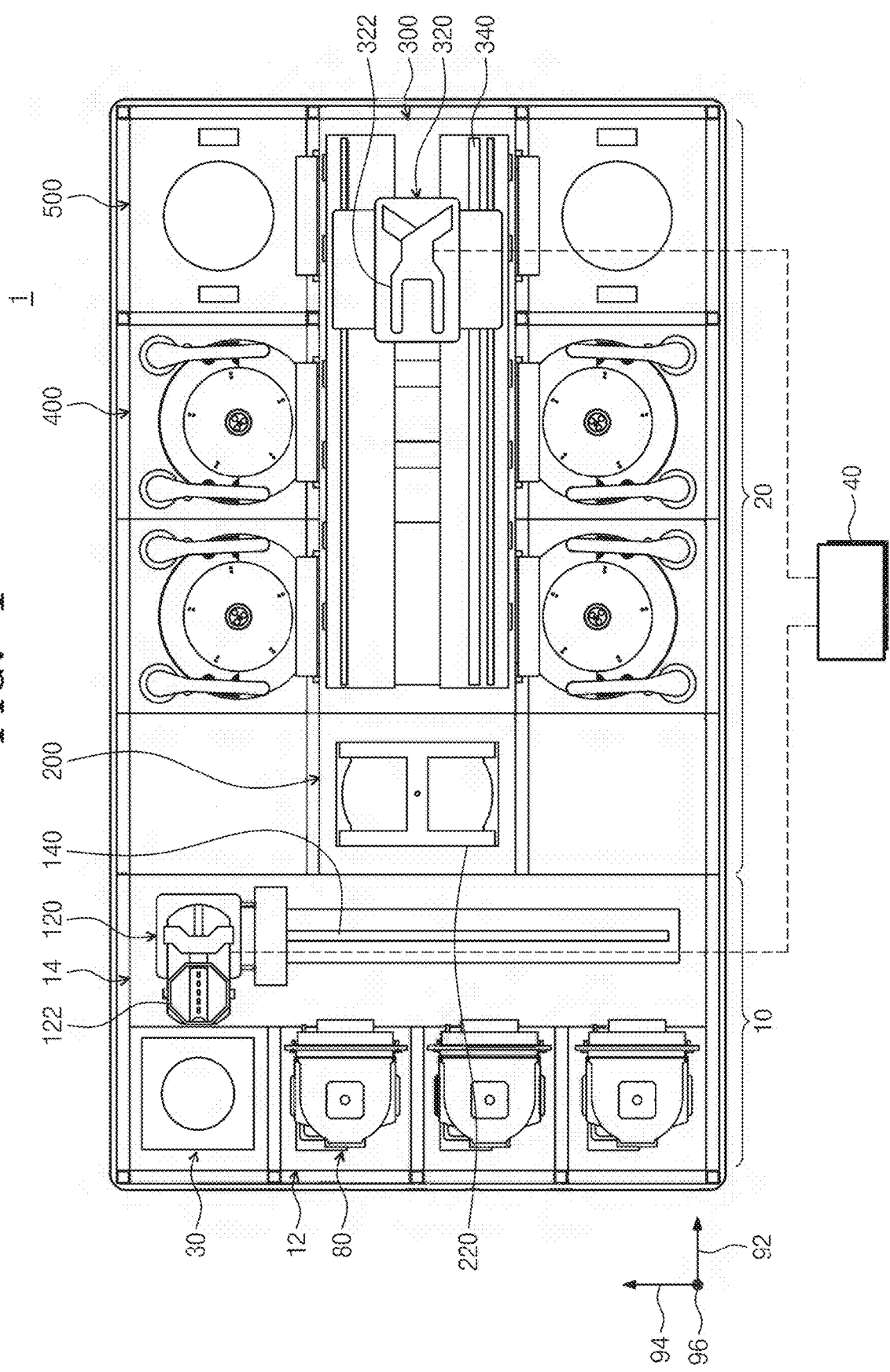
FIG. 1 is a top plan view schematically illustrating a substrate processing apparatus according to an exemplary embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a top plan view schematically illustrating a substrate processing apparatus according to an exemplary embodiment of the present invention.

Referring to FIG. 1, a substrate processing apparatus 1 includes an index module 10, a first treatment module 20, a second treatment module 30, and a controller 40. In one exemplary embodiment, the index module 10 and the first treatment module 20 are disposed along a first direction. Hereinafter, a direction in which the index module 10 and the first treatment module 20 are disposed is referred to as a first direction 92, a direction perpendicular to the first direction 92 when looking at the substrate processing apparatus 1 from the top is referred to as a second direction 94, and a direction perpendicular to both the first direction 92 and the second direction 94 is referred to as a third direction 96.

The index module 10 transfers a substrate W, such as a wafer, from a container 80 in which the substrate W is accommodated to the first treatment module 20, and accommodates the substrate W that has been processed in the first treatment module 20 to the container 80. A longitudinal direction of the index module 10 is provided in the second direction 94. The index module 10 includes a load port 12 and an index frame 14. With respect to the index frame 14, the load port 12 is located on the opposite side of the first treatment module 20. The containers 80 in which the substrates W are placed on the load port 12. A plurality of load ports 12 may be provided, and the plurality of load ports 12 may be disposed along the second direction 94.

As the container 80, an airtight container, such as a Front Open Unified Pod (FOUP), may be used. The container 80 may be placed on the load port 12 by a transfer means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The indexing robot 120 includes a hand 122 on which the substrate W is placed, and the hand 122 may be provided to be movable forward and backward, rotatable about the third direction 96, and movable along the third direction 96. The plurality of hands 122 is provided while being spaced apart from each other in the vertical direction, and is capable of independently moving forward and backward.

The first treatment module 20 includes a buffer unit 200, a transfer chamber 300, a liquid treatment chamber 400, and a drying chamber 500. The buffer unit 200 provides a space where the substrate W loaded into the first treatment module 20 and the substrate W unloaded from the first treatment module 20 temporarily reside. The liquid treatment chamber 400 performs a liquid treatment process of treating the substrate W with a liquid by supplying the liquid onto the substrate W. The drying chamber 500 performs a drying process of removing the liquid residual on the substrate W. The transfer chamber 300 transfers the substrate W between the buffer unit 200, the liquid treatment chamber 400, and the drying chamber 500.

The transfer chamber 300 may be provided so that a longitudinal direction is the first direction 92. The buffer unit 200 may be disposed between the index module 10 and the transfer chamber 300. The liquid treatment chamber 400 and the drying chamber 500 may be disposed on the side portion of the transfer chamber 300. The liquid treatment chamber 400 and the transfer chamber 300 may be disposed in the second direction 94. The drying chamber 280 and the transfer chamber 300 may be disposed in the second direction 94. The buffer unit 200 may be located at one end of the transfer chamber 300.

According to the example, the liquid treatment chambers 400 are disposed on both sides of transfer chamber 300, and the drying chambers 500 are disposed on both sides of the transfer chamber 300, and the liquid treatment chambers 400 may be disposed closer to the buffer unit 200 than the drying chambers 500. At one side of the transfer chamber 300, the liquid treatment chambers 400 may be provided in an arrangement of A×B (each of A and B is 1 or a natural number larger than 1) in the first direction 92 and the third direction 96. Further, at one side of the transfer chamber 300, the drying chambers 500 may be provided in number of C×D (each of C and D is 1 or a natural number larger than 1) in the first direction 92 and the third direction 96. Unlike the above, only the liquid treatment chambers 400 may be provided on one side of the transfer chamber 300, and only the drying chambers 500 may be provided on the other side of the transfer chamber 300.

The transfer chamber 300 includes a transfer robot 320. A guide rail 340 having a longitudinal direction in the first direction 92 is provided in the transfer chamber 300, and the transfer robot 320 may be provided to be movable on the guide rail 340. The transfer robot 320 includes a hand 322 in which the substrate W is placed, and the hand 322 may be provided to be movable forward and backward, rotatable about the third direction 96, and movable along the third direction 96. The plurality of hands 322 is provided while being spaced apart from each other in the vertical direction, and is capable of independently moving forward and backward.

The buffer unit 200 includes a plurality of buffers 220 on which the substrate W is placed. The buffers 220 may be disposed while being spaced apart from each other in the third direction 96. A front face and a rear face of the buffer unit 200 are opened. The front face is a face facing the index module 10, and the rear face is a face facing the transfer chamber 300. The index robot 120 may approach the buffer unit 200 through the front face, and the transfer robot 320 may approach the buffer unit 200 through the rear face.

The second treatment module 30 may be installed on the index module 10. The second treatment module 30 may be located with the load ports 12 of the index module 10 side by side. For example, the second treatment module 30 may be disposed with the load ports 12 in the second direction 94 side by side when the substrate processing apparatus 1 is viewed from the top. The second treatment module 30 may perform a light treatment on the substrate W. In addition, the second treatment module 30 may perform a cooling treatment on the substrate W.

The controller 70 may control the configurations of the substrate processing apparatus 1. For example, the controller 40 may control configurations of the index module 10, the first treatment module 20, and the second treatment module 30. Furthermore, the controller 40 controls the transfer robot 320 and the index robot 120 such that the processing of the substrate W occurs in a preset substrate processing order.

The controller 40 may include a process controller formed of a microprocessor (computer) that executes the control of the substrate processing apparatus 1, a user interface formed of a keyboard in which an operator performs a command input operation or the like in order to manage the substrate processing apparatus 1, a display for visualizing and displaying an operation situation of the substrate processing apparatus 1, and the like, and a storage unit storing a control program for executing the process executed in the substrate processing apparatus 1 under the control of the process controller or a program, that is, a treating recipe, for executing the process in each component according to various data and treating conditions. Further, the user interface and the storage unit may be connected to the process controller. The treating recipe may be stored in a storage medium in the storage unit, and the storage medium may be a hard disk, and may also be a portable disk, such as a CD-ROM or a DVD, or a semiconductor memory, such as a flash memory.

Figure 2:
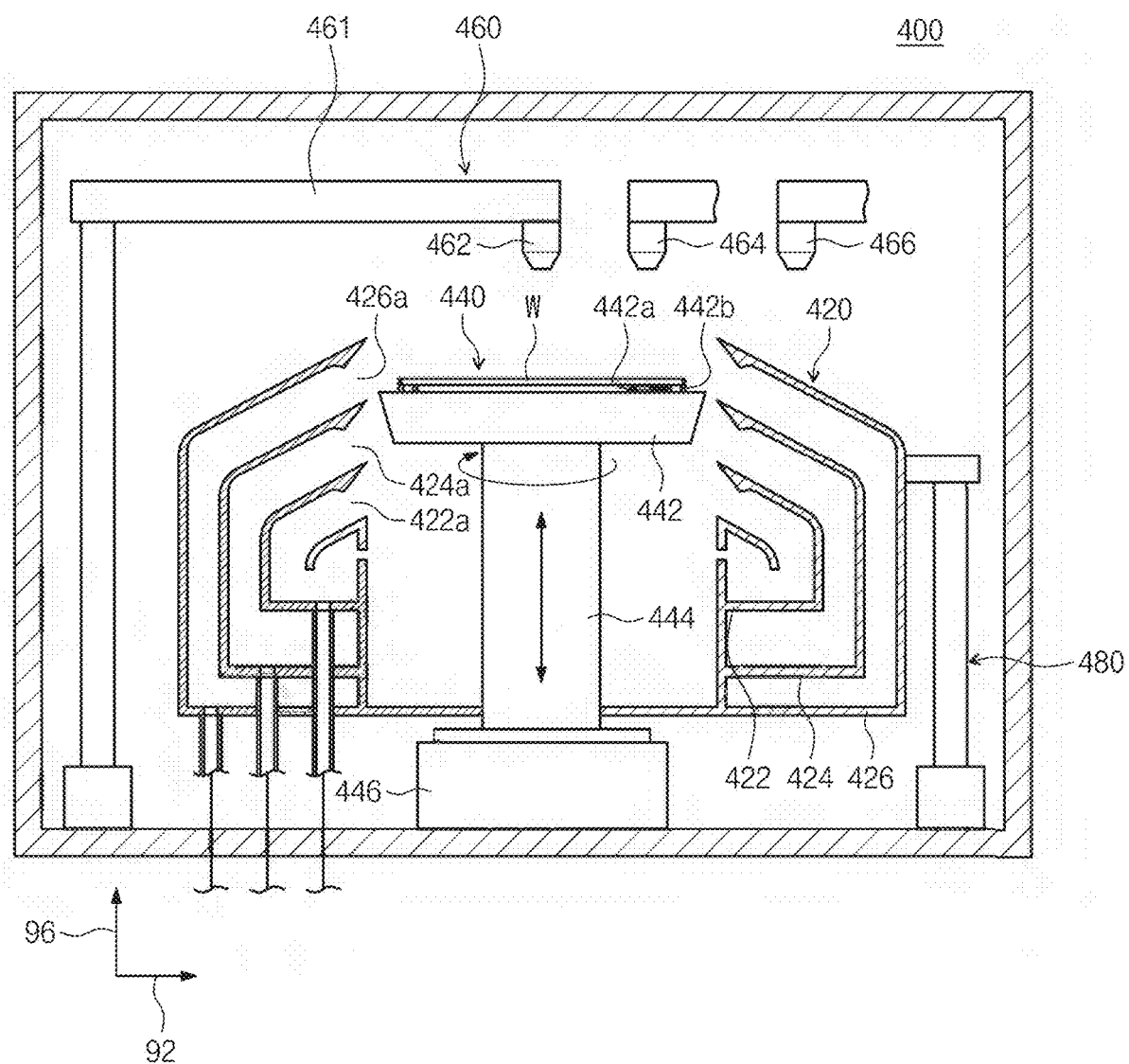
FIG. 2 is a diagram schematically illustrating an exemplary embodiment of a liquid treatment chamber of FIG. 1.

FIG. 2 is a diagram schematically illustrating an exemplary embodiment of the liquid treatment chamber of FIG. 1. Referring to FIG. 2, the liquid treatment chamber 400 may liquid treat the substrate W by supplying the substrate W with a treatment liquid. The liquid treatment chamber 400 has a housing 410, a cup 420, a support unit 440, a liquid supply unit 460, and a lifting unit 480. The housing 410 is provided in a generally rectangular parallelepiped shape. The cup 420, the support unit 440, and the liquid supply unit 460 are disposed in the housing 410.

The cup 420 has a treatment space with an open top, and the substrate W is liquid-treated in the treatment space. The support unit 440 supports the substrate W in the treatment space. The liquid supply unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to the example, the cup 420 includes a plurality of collection containers 422, 424, and 426. Each of the collection containers 422, 424, and 426 has a collection space of collecting the liquid used for the treatment of the substrate. Each of the collection containers 422, 424, and 426 is provided in a ring shape surrounding the support unit 440. When the liquid treatment process is in progress, the treatment liquid scattered by the rotation of the substrate W is introduced into the collection space through inlets 422a, 424a, and 426a of the respective collection containers 422, 424, and 426. According to the example, the cup 420 includes a first collection container 422, a second collection container 424, and a third collection container 426. The first collection container 422 is disposed to surround the support unit 440, the second collection container 424 is disposed to surround the first collection container 422, and the third collection container 426 is disposed to surround the second collection container 424. The second inlet 424a, which introduces the liquid into the second collection container 424, may be located above the first inlet 422a, which introduces the liquid into the first collection container 422, and the third inlet 426a, which introduces the liquid into the third collection container 426, may be located above the second inlet 424a.

The support unit 440 includes a support plate 442 and a driving shaft 444. An upper surface of the support plate 442 may be provided in a generally circular shape, and may have a diameter larger than a diameter of the substrate W. In the center portion of the support plate 442, a support pin 442a is provided to support the rear surface of the substrate W, and the support pin 442a is provided with its upper end protruding from the support plate 442 so that the substrate W is spaced apart from the support plate 442 by a certain distance. A chuck pin 442b is provided to an edge of the support plate 442. The chuck pin 442b is provided to protrude upward from the support plate 442, and supports the lateral portion of the substrate W so that the substrate W is not separated from the support unit 440 when the substrate W is rotated. The driving shaft 444 is driven by a driver 446, is connected to the center of the bottom surface of the substrate W, and rotates the support plate 442 with respect to the central axis thereof.

According to the example, the liquid supply unit 460 includes a first nozzle 462, a second nozzle 464, and a third nozzle 466.

The first nozzle 462 supplies a first liquid onto the substrate W. The first liquid may be the liquid of removing a film or foreign substances residual on the substrate W.

The second nozzle 464 supplies a second liquid onto the substrate W. The second liquid may be the liquid well soluble in a third liquid. For example, the second liquid may be the liquid that is better soluble in the third liquid than the first liquid. The second liquid may be the liquid that neutralizes the first liquid supplied onto the substrate W. Further, the second liquid may be the liquid that neutralizes the first solution and at the same time is better soluble in the third solution than the first solution. According to one example, the second liquid may be water.

The third nozzle 466 supplies the third liquid onto the substrate W. The third liquid may be a liquid that is well soluble in the supercritical fluid used in the drying chamber 500. For example, the third liquid may be a liquid that is more soluble in the supercritical fluid used in the drying chamber 500 than the second liquid. According to an example, the third liquid may be an organic solvent. The organic solvent may be isopropyl alcohol.

The first nozzle 462, the second nozzle 464, and the third nozzle 466 are supported on different arms 461, and the arms 461 may be moved independently. Optionally, the first nozzle 462, the second nozzle 464, and the third nozzle 466 may be mounted to the same arm and moved at the same time.

The lifting unit 480 moves the cup 420 in the vertical direction. By the vertical movement of the cup 420, a relative height between the cup 420 and the substrate W is changed. This changes the collection containers 422, 424, and 426 for collecting the treatment liquid according to the type of liquid supplied to the substrate W, so that the liquids may be collected separately. Unlike the description, the cup 420 may be fixedly installed, and the lifting unit 480 may move the support unit 440 in the vertical direction.

Figure 3:
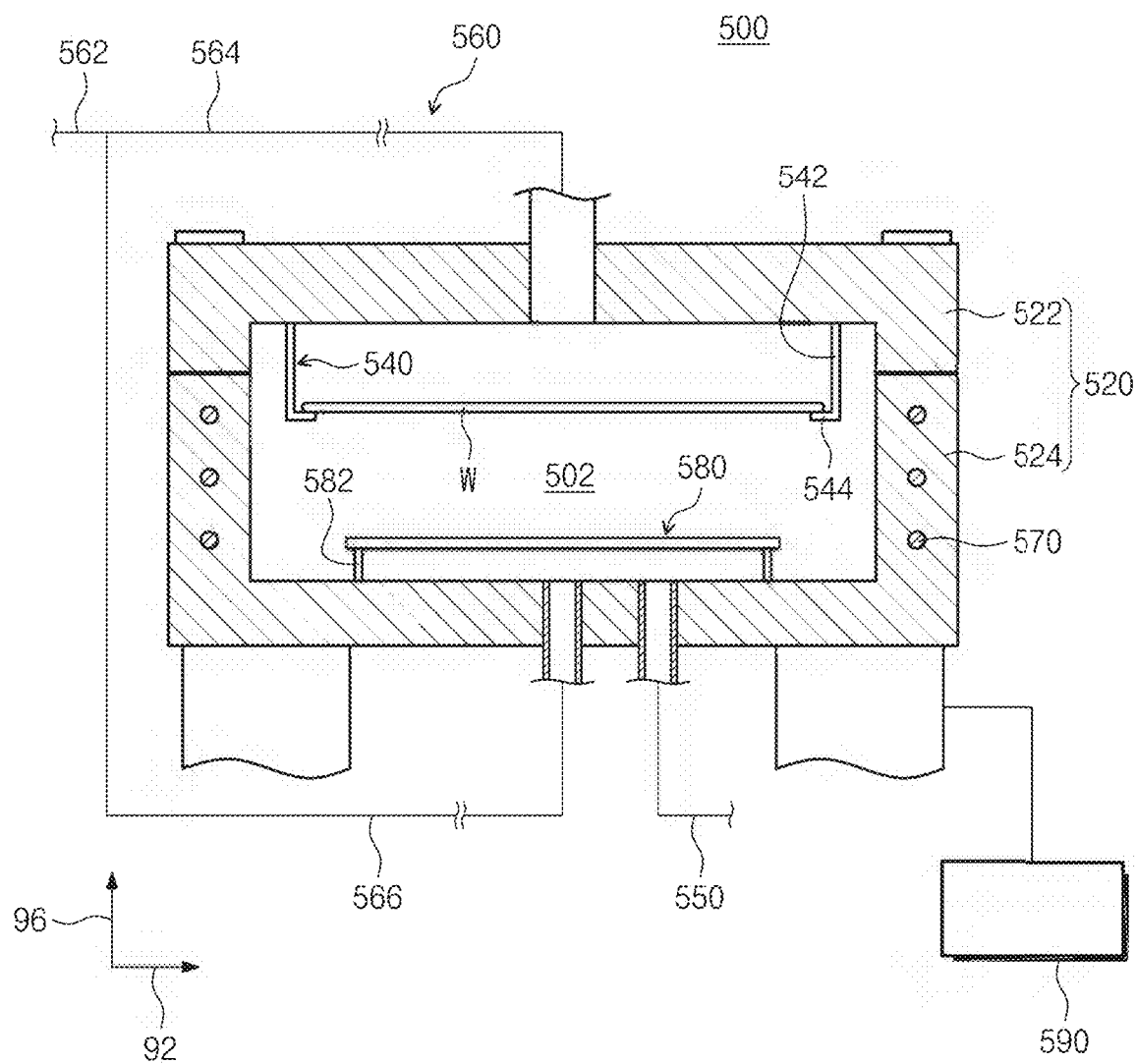
FIG. 3 is a diagram schematically illustrating an exemplary embodiment of a drying chamber of FIG. 1.

FIG. 3 is a diagram schematically illustrating an exemplary embodiment of the drying chamber of FIG. 1. The drying chamber 500 may provide a supercritical fluid to the substrate W that has been liquid treated in the liquid treatment chamber 400 to dry treat the substrate W. According to the exemplary embodiment, the drying chamber 500 removes the liquid on the substrate W by using a supercritical fluid. The drying chamber 500 includes a body 520, a support body 540, a fluid supply unit 560, and a blocking plate 580.

The body 520 provides an interior space 502 in which the drying process is performed. The body 520 includes an upper body 522 and a lower body 524, and the upper body 522 and the lower body 524 are combined with each other to provide the interior space 502 described above. The upper body 522 is provided above the lower body 524. The upper body 522 is fixed in position, and the lower body 524 may be raised and lowered by a drive member 590, such as a cylinder. When the lower body 524 is spaced apart from the upper body 522, the interior space 502 is opened, and in this case, the substrate W is loaded or unloaded. During the process, the lower body 524 is in close contact with the upper body 522, so that the interior space 502 is sealed from the outside.

The drying chamber 500 includes a heater 570. According to one example, the heater 570 is located inside the wall of the body 520. The heater 570 heats the interior space 502 of the body 520 so that the fluid supplied into the interior space of the body 520 maintains a supercritical state.

The support body 540 supports the substrate W in the interior space 502 of the body 520. The support body 540 includes a fixing rod 542 and a cradle 544.

The fixing rod 542 is fixedly installed on the upper body 522 so as to protrude downward from the bottom surface of the upper body 522. The fixing rod 542 is provided so that a longitudinal direction thereof is the vertical direction. A plurality of fixing rods 542 is provided and is positioned to be spaced apart from each other. The fixing rods 542 are disposed so that the substrate W does not interfere with the fixing rods 542 when the substrate W is loaded into or unloaded from the space surrounded by the fixing rods 542. The cradle 544 is coupled to each of the fixing rods 542.

The cradle 544 extends from the lower end of the fixing rod 542 toward the space surrounded by the fixing rods 542. Due to the above-described structure, the substrate W loaded into the interior space 502 of the body 520 has the edge region placed on the cradle 544, and the entire top surface area of the substrate W, a center region of the bottom surface area of the substrate W, and a portion of the edge region of the bottom surface of the substrate W are exposed to the drying fluid supplied to the interior space 502.

The fluid supply unit 560 supplies a drying fluid to the interior space 502 of the body 520. According to the example, the drying fluid may be supplied to the interior space 502 in a supercritical state. In contrast, the drying fluid may be supplied to the interior space 502 in a gaseous state and phase change to a supercritical state within the interior space 502. According to the example, the fluid supply unit 560 includes a main supply line 562, an upper branch line 564, and a lower branch line 566.

The upper branch line 564 and the lower branch line 566 are branched from the main supply line 562. The upper branch line 564 is coupled to the upper body 522 to supply drying fluid from the top of the substrate W placed on the support 540. According to the example, the upper branch line 564 is coupled to the center of the upper body 522.

The lower branch line 566 is coupled to the lower body 524 to supply a drying fluid from the lower portion of the substrate W placed on the support 540. According to the example, the lower branch line 566 is coupled to the center of the lower body 524. An exhaust line 550 is coupled to the lower body 524. The supercritical fluid in the interior space 502 of the body 520 is exhausted to the outside of the body 520 through the exhaust line 550.

A blocking plate 580 may be disposed in the interior space 502 of the body 520. The blocking plate 580 may be provided in a disk shape. The blocking plate 580 is supported by a support 582 so as to be spaced upward from the bottom surface of the body 520. The support 582 is provided in a rod shape, and a plurality of supports 582 is arranged to be spaced apart from each other by a predetermined distance. When viewed from above, the blocking plate 580 may be provided to overlap the outlet of the lower branch line 566 and the inlet of the exhaust line 550. The blocking plate 580 may prevent drying fluid supplied through the lower branch line 566 from being discharged directly toward the substrate W and damaging the substrate W.

Figure 4:
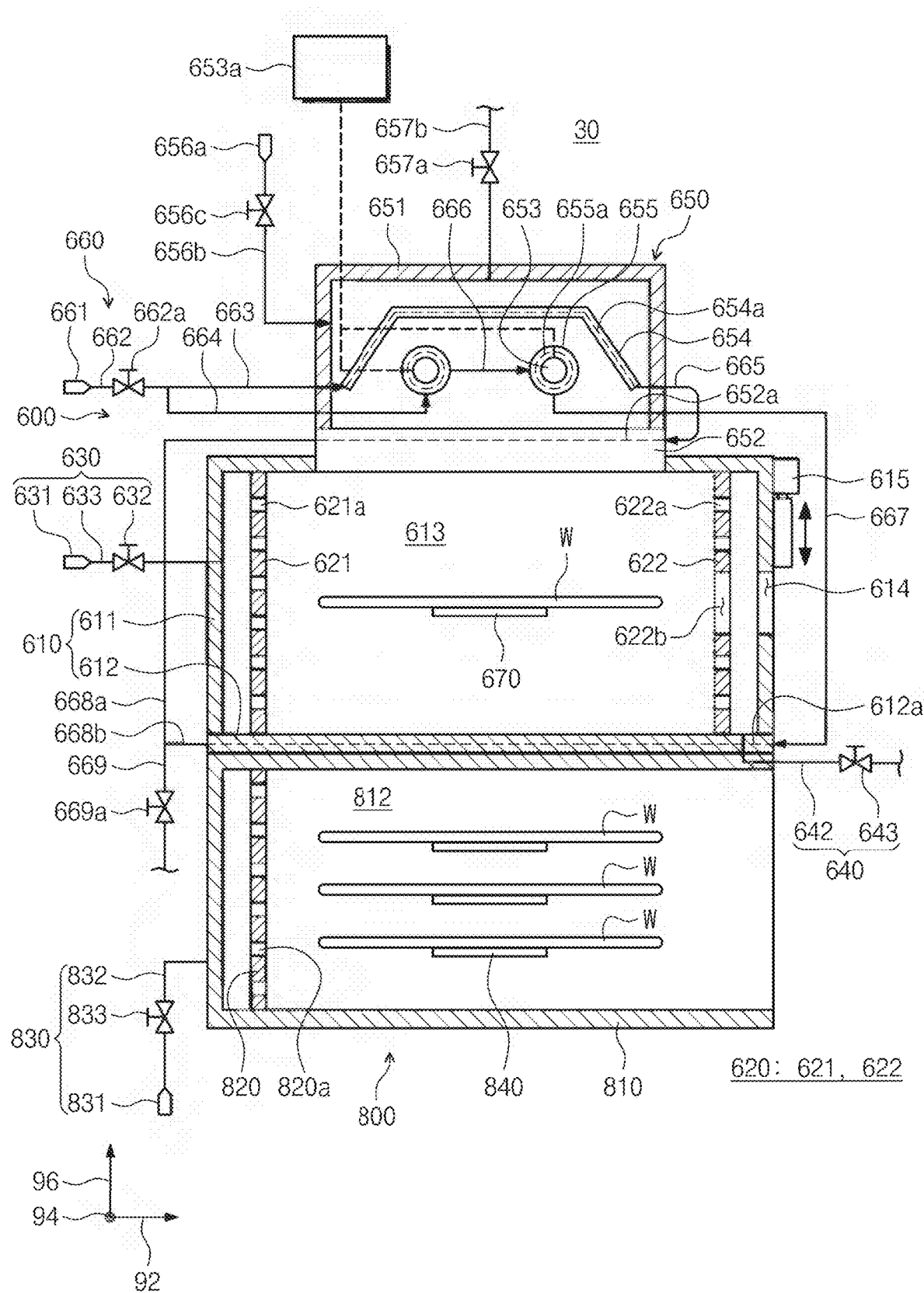
FIG. 4 is a perspective view schematically illustrating an example of the second treatment module of FIG. 1.

FIG. 4 is a perspective view schematically illustrating an example of the second treatment module of FIG. 1. Referring to FIG. 4, the second treatment module 30 includes a light treatment chamber 600 and a cooling chamber 800.

The light treatment chamber 600 irradiates the substrate W dried in the drying chamber 500 with light by using a supercritical fluid to remove any residual organic matter on the substrate W. The organic matter may be a material that is not completely removed from the substrate W in the drying process and remains. Alternatively, the organic matter may be the material generated when the substrate W is treated with a supercritical fluid. The cooling chamber 800 cools the light-treated substrate W in the light treatment chamber 600. The light treatment chamber 600 and the cooling chamber 800 are disposed to be stacked with each other. According to the example, the light treatment chamber 600 is located at the upper side of the cooling chamber 800. In contrast, the light treatment chamber 600 may be disposed downstream of the cooling chamber 800. Optionally, the light treatment chamber 600 may be disposed to the side of the cooling chamber 800. The light treatment chamber 600 and the cooling chamber 800 may each be provided. Optionally, at least one of the light treatment chamber 600 and the cooling chamber 800 may be provided in plurality.

Figure 5:
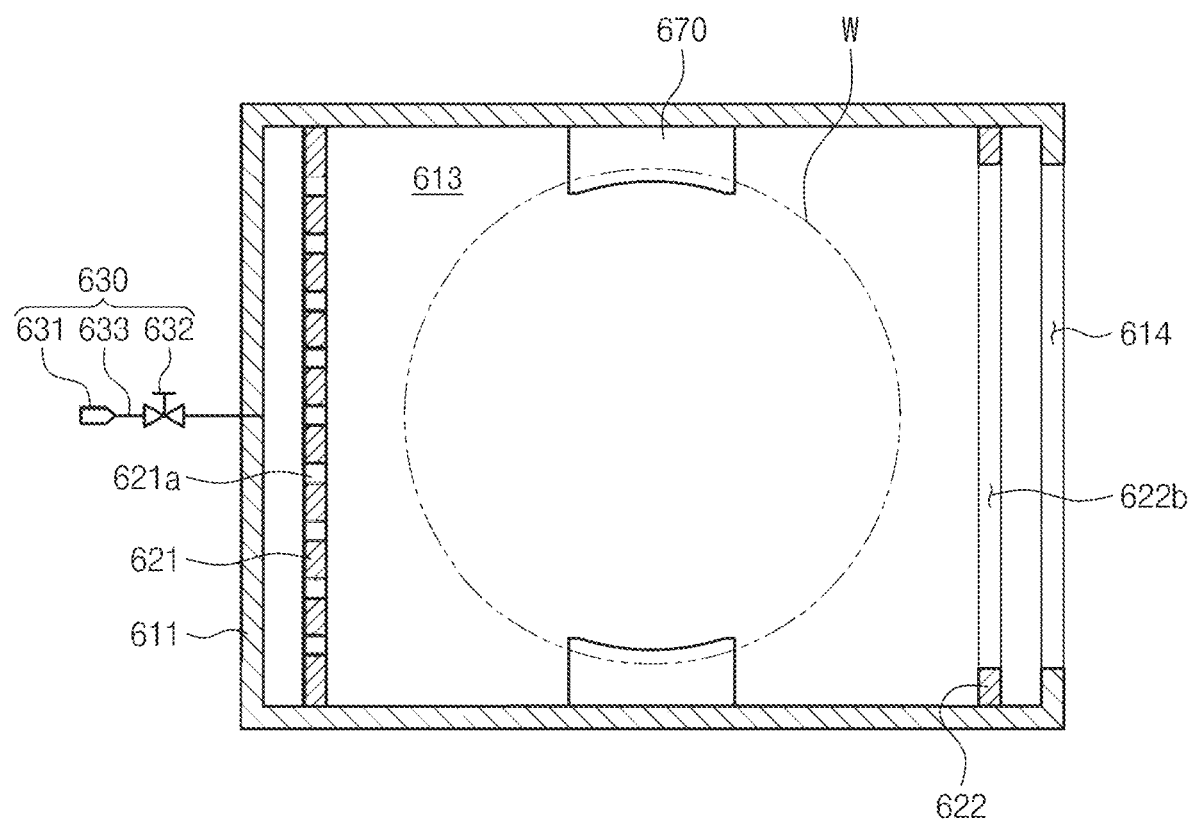
FIG. 5 is a planar cross-sectional view of a treatment housing of a light treatment chamber of FIG. 4.

In the following, the light treatment chamber 600 is described. FIG. 5 is a planar cross-sectional view of a treatment housing of the light treatment chamber of FIG. 4.

Referring to FIGS. 4 and 5, the light treatment chamber 600 may include a treatment housing 610, a gas distribution plate 620, a gas supply unit 630, a gas exhaust unit 640, a light irradiation unit 650, a refrigerant supply unit 660, and a support member 670.

The treatment housing 610 may provide a space in which the substrate W is processed. The treatment housing 610 may provide a treatment space 613 where the substrate W is light-treated. The treatment housing 610 may include a housing body 611, a cooling plate 612, and a door 615.

The housing body 611 may have a barrel shape with an open bottom. An opening may be formed in the upper center region of the housing body 611. On the lower side of the housing body 611, the cooling plate 612 may be installed. In the opening formed in the upper center region of the housing body 611, a middle plate 652 to be described later may be inserted. The housing body 6112, the cooling plate 612, and the middle plate 652 to be described later may be combined with each other to define the treatment space 613.

The inlet may be formed on one side of the housing body 611. The inlet 614 may be opened and closed by a door 615 mounted on the exterior of the housing body 611. The inlet 614 may be formed at a location facing the index robot 120 described above. While the substrate W is being light-treated, the door 615 may close the inlet 614. When the substrate W is loaded into or unloaded from the light treatment chamber 600, the door 615 may open the inlet 614.

The cooling plate 612 installed on the lower side of the housing body 611 may minimize the transfer of heat generated by the light-treatment of the substrate W, or heat generated by the light emitted by the light source 653, to the cooling chamber 800 located on the lower side of the light treatment chamber 600. A cooling plate refrigerant flow path 612a may be formed in the cooling plate 612. In the cooling plate refrigerant flow path 612a, refrigerant supplied by the refrigerant supply unit 660 described later may flow.

The gas distribution plate 620 helps to ensure that the treatment space 613 is uniformly supplied with gas supplied by the gas supply unit 630. The gas distribution plate 620 may be installed in the treatment space 613. The gas distribution plate 620 may be installed to face an inner wall of the treatment housing 610. The gas distribution plate 620 may include a gas supply plate 621 and a gas exhaust plate 622.

The gas supply plate 621 may be installed to face the gas supplied by a gas supply line 633 of the gas supply unit 630 described later. Supply holes 621a may be formed in the gas supply plate 621. Gas supplied by the gas supply unit 630, which will be described below, may be introduced into the treatment space 613 through the supply holes 621*a* of the gas supply plate 621.

The gas exhaust plate 622 may be installed to face the inlet 614 formed in the treatment housing 610. Exhaust holes 622*a* may be formed in the gas exhaust plate 622. The gas exhaust plate 622 may be installed in a symmetrical position relative to the gas supply plate 621, with respect to the center of the treatment space 613.

The gas supplied by the gas supply unit 630 may be exhausted sequentially through the gas supply plate 621, the treatment space 613, and the gas exhaust plate 622. That is, in the treatment space 613, an air current is formed along the first direction X by the gas supplied by the gas supply unit 630, and the air current may serve to discharge the organic matter that is decomposed and/or removed from the substrate W to the outside.

The gas supply unit 630 may supply gas to the treatment space 613. The gas supplied by the gas supply unit 630 may be inert gas. For example, the gas supplied by the gas supply unit 630 may be nitrogen, or inert gas, such as argon. The gas supply unit 630 may include a gas supply source 631, a gas supply valve 632, and the gas supply line 633.

The gas supply source 631 may be a supply source that stores and/or supplies the inert gas described above. The gas supply source 631 may be a gas storage tank that stores and/or supplies inert gas. The gas supply source 631 may be connected to the gas supply line 633. The gas supply valve 632 is installed in the gas supply line 633, which may control whether the gas supply unit 630 supplies gas and/or the gas supply flow rate per unit time. The gas supply valve 632 may be a flow control valve, or may be an open/close valve.

The gas supply line 633 may be connected to the gas supply source 631 and the treatment housing 610. The gas supply line 633 may be connected to a sidewall of the treatment housing 610. The gas supply line 633 may supply gas to the space between the treatment housing 610 and the gas supply plate 621. The inert gas supplied by the gas supply line 633 may be introduced into the treatment space 613 via the gas supply plate 621.

The gas exhaust unit 640 may exhaust the gas supplied by the gas supply unit 630. The gas exhaust unit 640 may include a gas exhaust line 642, and a gas exhaust valve 643. The gas exhaust line 642 may be connected to an exhaust device (not shown), such as a pump. The exhaust device may generate depressurization, and the depressurization generated by the exhaust device may exhaust the gas supplied to the treatment space 613. The gas exhaust line 642 may be connected between the gas exhaust plate 622 and the inner wall of the treatment housing 610. The gas exhaust line 642 may be connected between the inner wall of the treatment housing 610, in which the inlet 614 is formed, and the gas exhaust plate 622.

The gas exhaust valve 643 may control whether the gas exhaust unit 640 exhausts gas and/or the gas exhaust flow rate per unit time. The gas exhaust valve 643 may be a flow control valve, or may be an open/close valve.

The gas supplied by the gas supply unit 630 may be introduced into the treatment space 613 via the gas supply plate 621, and the gas introduced into the treatment space 613 may be discharged to the outside through the gas exhaust unit 640 via the gas exhaust plate 622. The location where the gas is supplied and the location where the gas is exhausted face each other when looking at the treatment space 613 from the top. Thus, in the treatment space 613, air current occurs by the gas flowing along the first direction 92.

The air current discharges the organic matter being removed from the substrate W to the outside of the light treatment chamber 600.

The light irradiation unit 650 may irradiate the substrate W supported in the treatment space 613 with light. The light irradiation unit 650 may irradiate the substrate W with light in the form of pulses. The light irradiation unit 650 may irradiate the substrate W with light having wavelengths in the visible light range.

The light irradiation unit 650 may include a light source housing 651, a middle plate 652, a light source 653, a light source controller 653*a*, a reflective member 654, a light source tube 655, air supply modules 656*a*, 656*b*, and 656*c*, and air exhaust modules 657*a* and 657*b*.

The light source housing 651 may have a barrel shape with an open bottom. The light source housing 651 may be located on top of the treatment housing 610. The light source housing 651 may define a light source placement space in which the light source 653 may be placed. The light source housing 651 may be combined with the middle plate 652 to define a light source placement space. The light source housing 651 may be formed with a smaller width in the first direction X than the treatment housing 610.

On the bottom side of the light source housing 651, a middle plate 652 may be installed. The middle plate 652 may have a plate shape. The middle plate 652 may be disposed between the light source housing 651 and the treatment housing 610. The middle plate 652 may compartmentalize the treatment space 613 and the light source placement space of the light source housing 651 from each other. The middle plate 652 may be formed of a transparent material to allow light generated by the light source 653 to pass through. For example, the middle plate 652 may be formed of a transparent quartz material. Additionally, the middle plate 652 may have a middle plate refrigerant flow path 652*a* formed through which refrigerant supplied by the refrigerant supply unit 660, described later, may flow.

The light source 653 may generate light that is emitted onto the substrate W. The light source 653 may irradiate the substrate W with light to remove residual organic matters on the substrate W. The light source 653 may be a flash lamp. The light source 653 may be a xenon flash lamp. The light source 653 may generate glare. The light source 653 may generate light in the form of pulses. The reason the light source 653 generates light in the form of pulses is that the light source 653 is capable of irradiating the substrate W with light that is generated at a greater output (that is, has greater energy) even though consuming the same power.

For example, when the light source 653 generates light in the form of pulses, the light source 653 may include an on state and an off state. The on state and the off state may be repeated. The on state may be a state in which the light source 653 generates light, and the off state may be a state in which the light source 653 does not generate light. Additionally, when the light source 653 generates light in the form of pulses, the light source 653 may include a high state and a low state. The high state may be a state in which the output of the light generated by the light source 653 is large, and the low state may be a state in which the output of the light generated by the light source 653 is small.

Assuming the same power is consumed, when the light source 653 generates light in the form of pulses, the light may have a higher output peak when the light source 653 is in the on or high state, compared to when the light source 653 generates light continuously. Thus, when the light source 653 generates light in the form of pulses, it has the advantage of effectively removing organic matter on the substrate W even though the light source 653 consumes the same power.

Additionally, the light source 653 may have a generally rod shape. A longitudinal direction of the light source 653 may be parallel to the second direction 94. Additionally, a plurality of light sources 653 may be installed. Two light sources 653 may be installed. The light sources 653 may be disposed side-by-side along the first direction 92.

Additionally, the light source 653 may be configured to generate light in the full wavelength range (300 to 1000 nm), which includes the visible light wavelength range, the infrared wavelength range, and the ultraviolet wavelength range.

The light source controller 653a may control the operation of the light source 653. The light source controller 653a may be configured to control at least one of an output of light generated by the light source 653, a duty ratio in a unit pulse of light, and a period of a unit pulse of light. The light source controller 653a may include a processor, circuit elements, and the like that may control the operation of the light source 653.

The reflective member 654 may reflect light emitted by the light source 653. The reflective member 654 may reflect light traveling upward from the light source 653 in a direction toward the substrate W. The reflective member 654 may have a plate shape with a longitudinal second direction 94, with both ends bent toward the light source 653. The reflective member 654 may be installed on top of the light source 653. The reflective member 654 may have a reflective film attached that may reflect light emitted by the light source 653, or may be coated with a reflective component that may reflect light. In addition, the reflective member 654 may have a reflective member refrigerant flow path 654a formed through which refrigerant supplied by the refrigerant supply unit 660, described later, may flow.

The light source tube 655 may have a shape that surrounds the light source 653. The light source tube 655 may have a tube shape into which the rod-shaped light source 653 may be inserted. For example, the light source tube 655 may have a tube shape with a perforated center region in the same direction as the length direction of the light source 653. The light source 653 may be inserted into the light source tube 655.

The light source tube 655 may be formed of a transparent material to allow light generated by the light source 653 to be transmitted. For example, the light source tube 655 may be formed of a transparent quartz material. Within the light source tube 655, a light source tube refrigerant flow path 655a may be formed through which refrigerant supplied by the refrigerant supply unit 660 described later may flow. Refrigerant flowing in light source tube refrigerant flow path 655a may cool the light source 653. Thus, the temperature of the light source 653 may be prevented from becoming excessively high.

Additionally, an inner surface of the light source tube 655 that is in contact with the light source 653 and/or an outer surface of the light source tube 655 may have a light filter film attached to selectively allow a set range of wavelengths of light generated by the light source 653 to pass through. In contrast, the inner surface in contact with the light source 653 and/or the outer surface of the light source tube 655 may be coated with a coating layer to selectively allow a set range of wavelengths of light generated by the light source 653 to pass through. In this case, the light source tube 655 may function as a light filter that selects a set range of wavelengths of light generated by the light source 653 and allows the wavelengths to pass through.

The light source tube 655 may be configured to selectively pass wavelengths in the visible light range. For example, the light source tube 655 may be configured to selectively pass wavelengths in the range of 350 to 700 nm.

Air supply modules 656a, 656b, and 656c may supply temperature- and humidity-controlled Clean Dry Air (CDA) to a space within the light source housing 651. The air supply modules 656a, 656b, and 656c may include an air supply source 656a that supplies CDA, an air supply line 656b that supplies CDA from the air supply source 656a to the light source housing 651, and an air supply valve 656c that is installed in the air supply line 656b.

The air exhaust modules 657a and 657b may exhaust the CDA supplied into the space within the light source housing 651. The air exhaust modules 657a and 657b may include an air exhaust line 657b connected to the light source housing 651, and an air exhaust valve 657a installed in the air exhaust line 657b.

The refrigerant supply unit 660 may supply refrigerant to the components of the light treatment chamber 600 to inhibit the temperature of the light treatment chamber 600 from increasing. When the light source 653 in the light treatment chamber 600 continuously generates light, the energy carried by the light may be accumulated and cause the temperature of the components in the light treatment chamber 600 to become excessively high. The refrigerant supply unit 660 may supply a refrigerant, such as coolant or cooling gas, to the components of the light treatment chamber 600 to inhibit the temperature of the light treatment chamber 600 from increasing.

The refrigerant supply unit 660 may include a refrigerant supply source 661, a refrigerant supply line 662, a first supply line 663, a second supply line 664, a first delivery line 665, a second delivery line 666, a third delivery line 667, a first refrigerant discharge line 668a, a second refrigerant discharge line 668b, and a main refrigerant discharge line 669. Further, the refrigerant supply unit 660 may include a refrigerant supply valve 662a installed in the refrigerant supply line 662, and a refrigerant discharge valve 669a installed in the main refrigerant discharge line 669. Each of the valves 662a and 669b may control the supply and discharge of the refrigerant. Additionally, each of the valves 662a, 669b may be provided as an open/close valve or a flow control valve.

The refrigerant supply source 661 may be a refrigerant storage tank storing the coolant or cooling gas described above. The refrigerant supply source 661 may be configured to store and/or supply refrigerant. The refrigerant stored in the refrigerant supply source 661 may be supplied to the components of the light treatment chamber 600 via the refrigerant supply line 662. The refrigerant supply line 662 may branch into a first supply line 663 and a second supply line 664.

The first supply line 663 may supply refrigerant to the reflective member refrigerant flow path 654a. The refrigerant flowing in the reflective member refrigerant flow path 654a may prevent the temperature of the reflective member 654 from becoming excessively high. The reflective member refrigerant flow path 654a may be connected to the first delivery line 665. The first delivery line 665 may be connected to the middle plate refrigerant flow path 652a. The refrigerant flowing in the middle plate refrigerant flow path 654a may prevent the temperature of the middle plate 652 from becoming excessively high.

The middle plate refrigerant flow path 654a may be connected to the first refrigerant discharge line 668a. The first refrigerant discharge line 668a may be connected to the main refrigerant discharge line 669. The refrigerant delivered to the main refrigerant discharge line 669 may be discharged to the outside of the substrate processing apparatus 1, or may be circulated and delivered to the refrigerant supply source 661.

The second supply line 664 may supply refrigerant to the light source tube refrigerant flow path 655a of any one of the light source tubes 655. The second delivery line 666 may be connected to the light tube refrigerant flow path 655a of any one of the light source tubes 655 and the light tube refrigerant flow path 655a of another of the light source tubes 655. The second delivery line 666 may deliver refrigerant from the light tube refrigerant flow path 655a of any one of the light source tubes 655 to the light tube refrigerant flow path 655a of another of the light source tubes 655. The refrigerant flowing in the light source tube refrigerant flow path 655a may prevent the temperature of the light source tube 655 from becoming excessively high, and may also prevent the temperature of the light source 653 from becoming excessively high.

The light source 653 heats the substrate W by the energy delivery manner using light, rather than the method of directly emitting heat and heating the substrate W. Thus, the light source 653 is cooled by the light source tube 655, so that the efficiency of removing organic matter adhering to the substrate W is not reduced.

The third delivery line 667 may deliver refrigerant from the light source tube refrigerant flow path 655a of another of the light source tubes 655 to the cooling plate refrigerant flow path 612a. The refrigerant flowing in the cooling plate refrigerant flow path 612a lowers the temperature of the cooling plate 612. In addition, the cooling plate 612 may minimize the delivery of heat generated during the process of processing the substrate W to the cooling chamber 800.

The cooling plate refrigerant flow path 612a may be connected to the second refrigerant discharge line 668b. The second refrigerant discharge line 668b may be connected to the main refrigerant discharge line 669. The refrigerant delivered to the main refrigerant discharge line 669 may be discharged to the outside of the substrate processing apparatus 1, or may be circulated and delivered to the refrigerant supply source 661.

The support member 670 may support the substrate W. The support member 670 may be configured to support the bottom surface of the substrate W. The support member 670 may also be referred to as a substrate holder. The support member 670 may be configured to support a bottom edge region of the substrate W.

The following describes the cooling chamber 800.

Referring again to FIG. 4, the cooling chamber 800 may include a cooling housing 810, a gas injection plate 820, a cooling gas supply unit 830, and a support shelf 840.

The cooling chamber 800 may provide a cooling treatment for the substrate W. The cooling chamber 800 may cool the substrate W that has been light-treated in the light treatment chamber 600.

The cooling housing 810 may have a barrel shape with open sides. For example, the cooling housing 810 may have a barrel shape with an open side facing the index robot 120. The cooling housing 810 may define a cooling space 812.

The gas injection plate 820 may be installed in the cooling space 812. The gas injection plate 820 may have injection holes 820a.

The cooling gas supply unit 830 may supply cooling gas to the cooling space 812. The cooling gas may be inert gas. For example, the cooling gas may be inert gas, such as nitrogen or argon. The cooling gas supply unit 830 may include a cooling gas supply source 831, a cooling gas supply line 832, and a cooling gas supply valve 833.

The cooling gas supply source 831 may supply and/or store inert gas. The cooling gas supply source 831 may be a gas storage tank that stores the inert gas. In some cases, the cooling gas supply source 831 and the gas supply source 631 described above may be the same configuration. The inert gas supplied by the cooling gas supply source 831 may be supplied to the cooling space 812 via the cooling gas supply line 832. The cooling gas may be supplied to the space between the cooling housing 810 and the gas injection plate 820. The cooling gas supply valve 833 installed in the cooling gas supply line 832 may regulate whether to supply cooling gas to the cooling space 812, or the supply flow rate per unit time. The cooling gas supply valve 833 may be an open/close valve, or may be provided as a flow control valve.

The support shelf 840 may support the substrates W. The support shelf 840 may support the substrates W which have been completely light-treated in the light treatment chamber 600. The support shelf 840 may have the same or similar shape as the support member 670 described above. The plurality of support shelves 840 may be installed in the cooling space 812 along the third direction 96.

On the other hand, a side portion of the cooling housing 810 may be open. The open portion of the cooling housing 810 may be opposite to the portion on which the gas injection plate 820 is installed. The cooling gas supplied through the gas injection plate 820 may form a continuous or intermittent air current along the first direction 92. The cooling gas may minimize particles that may be suspended in the index module 10 from being introduced into the cooling space 812. Furthermore, since the substrates W that are loaded into the cooling housing 810 are the substrates W that have been stripped of organic matter in the light treatment chamber 600, the possibility of contamination of the cooling space 812 by organic matter adhering to the substrates W is very low.

Figure 6:
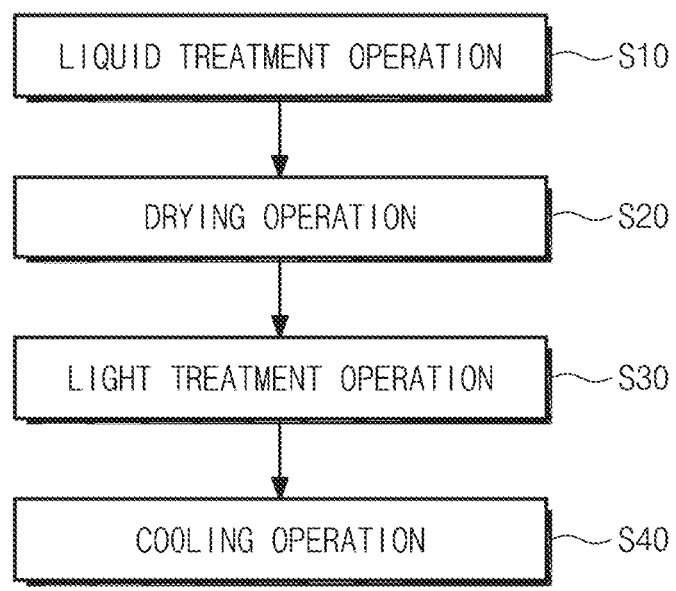
FIG. 6 is a flow chart schematically illustrating a substrate processing method according to an exemplary embodiment of the present invention.

FIG. 6 is a flow chart schematically illustrating a substrate processing method according to an exemplary embodiment of the present invention.

Referring to FIG. 6, a substrate processing method according to an exemplary embodiment of the present invention may include a liquid treatment operation S10, a drying operation S20, a light treatment operation S30, and a cooling operation S40. The above operations may be performed sequentially. Further, in order to perform each operation, the transfer robot 320 and the index robot 120 provided by the substrate processing apparatus 1 may transfer the substrate W sequentially. For example, the transfer robot 320 and the index robot 120 may sequentially transfer the substrate W to the liquid treatment chamber 400, the drying chamber 500, the light treatment chamber 600, and the cooling chamber 800. The substrates W cooled in the cooling chamber 800 may be transferred by the index robot 120 to the container 80 placed on the load port 12 and unloaded to the outside of the substrate processing apparatus 1.

Figure 7:
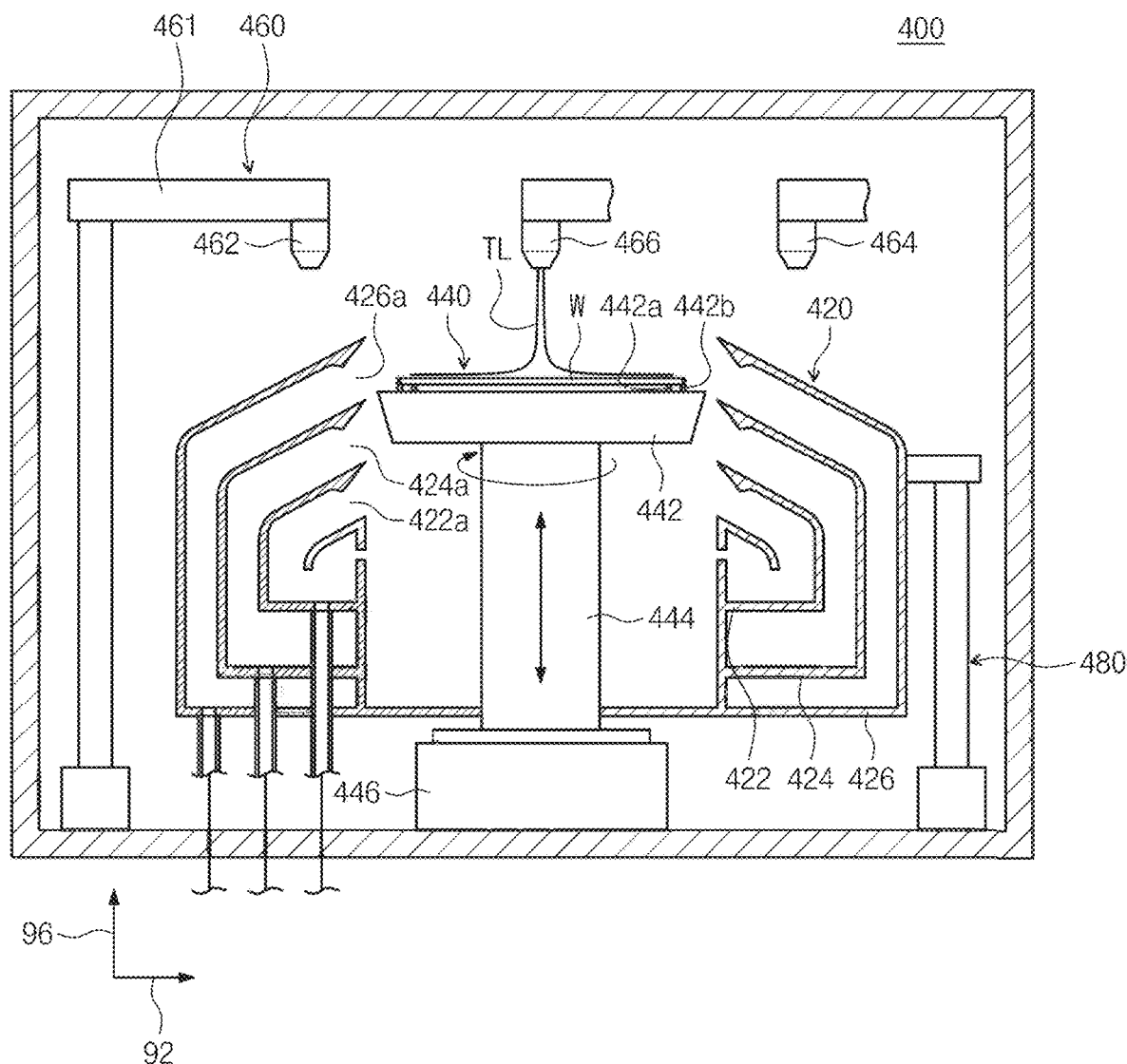
FIG. 7 is a diagram illustrating a view of the substrate processing apparatus performing a liquid treatment operation of FIG. 6.

FIG. 7 is a diagram illustrating a view of the substrate processing apparatus performing the a liquid treatment operation of FIG. 6.

Referring to FIGS. 6 and 7, the liquid treatment operation S10 may include liquid treatment of the substrate W by supplying a treatment liquid TL to the substrate W rotating in the liquid treatment chamber 400. The treatment liquid TL may be a rinse liquid, such as pure water, or an organic solvent, such as IPA. FIG. 7 illustrates the case where the third nozzle 466 supplies an organic solvent as an example. In addition, the liquid treatment chamber 400 may sequentially supply a rinse liquid and an organic solvent to clean the substrate W. The rinse liquid may clean the substrate W. When the rinse liquid is pure water, it may be difficult to remove the rinse liquid that has penetrated between the patterns on the substrate W due to the relatively high surface tension of pure water. Therefore, when the rinse solution is supplied to the substrate W and then an organic solvent is additionally supplied, the rinse solution on the substrate W may be replaced by an organic solvent with relatively low surface tension. When the organic solvent is IPA, the surface tension of IPA is relatively low and may be easily removed from the substrate W.

Figure 8:
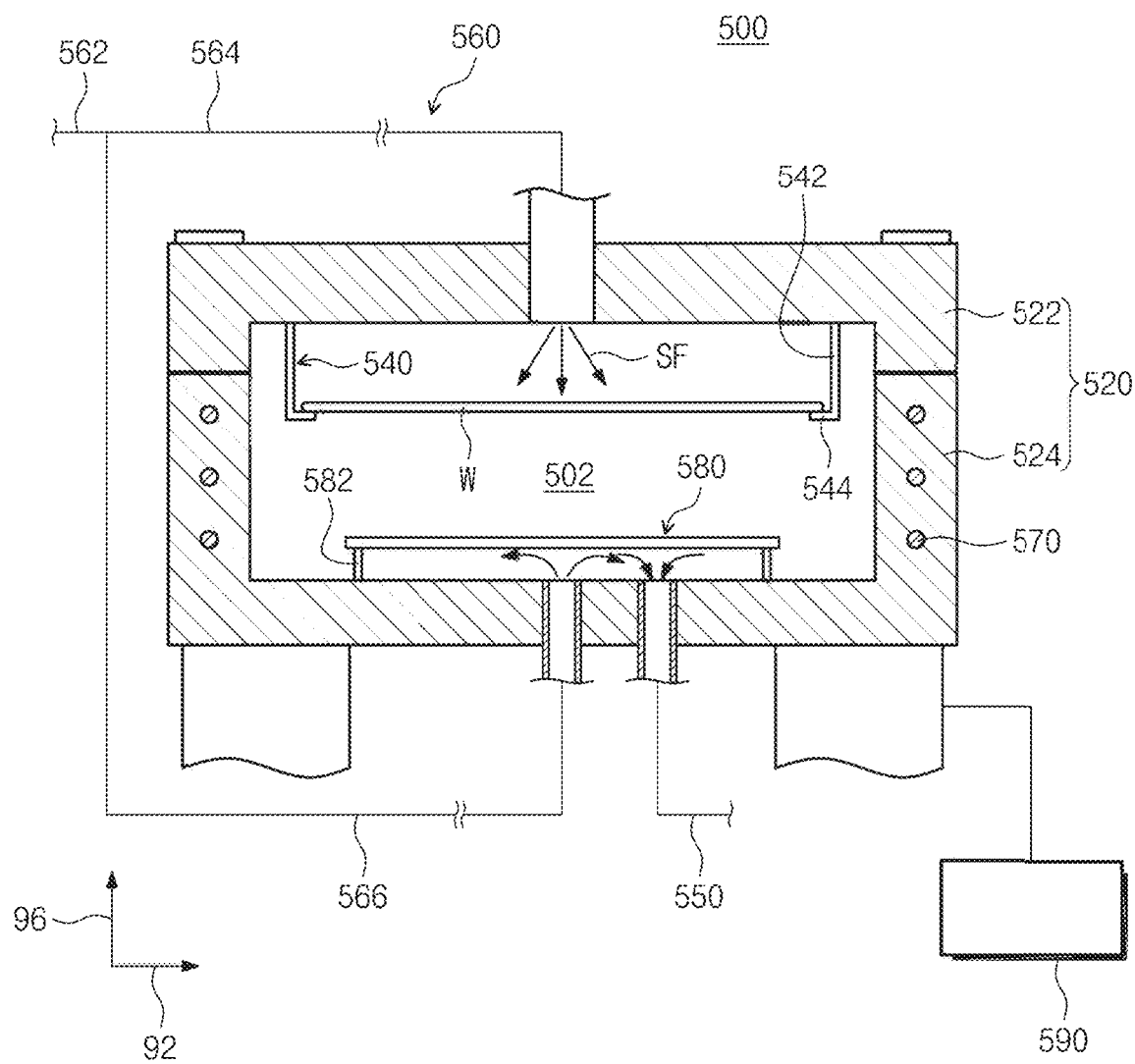
FIG. 8 is a diagram illustrating a view of the substrate treatment apparatus performing a drying operation of FIG. 6.

FIG. 8 is a diagram illustrating a view of the substrate treatment apparatus performing the drying operation of FIG. 6.

Referring to FIGS. 6 and 8, in the drying operation S20, the substrate W may be dry treated by supplying a supercritical fluid SF to the liquid-treated substrate W in the drying chamber 500. The substrate W may be loaded into to the drying chamber 500 with a liquid film formed by the organic solvent on the substrate W. The supercritical fluid SF may be carbon dioxide gas in a supercritical state. The supercritical fluid SF may dry the liquid film formed on the substrate W. In addition, because the supercritical fluid SF has very good penetration into the patterns formed on the substrate W, the supercritical fluid SF may very effectively remove the treatment liquid TL remaining on the substrate W.

Figure 9:
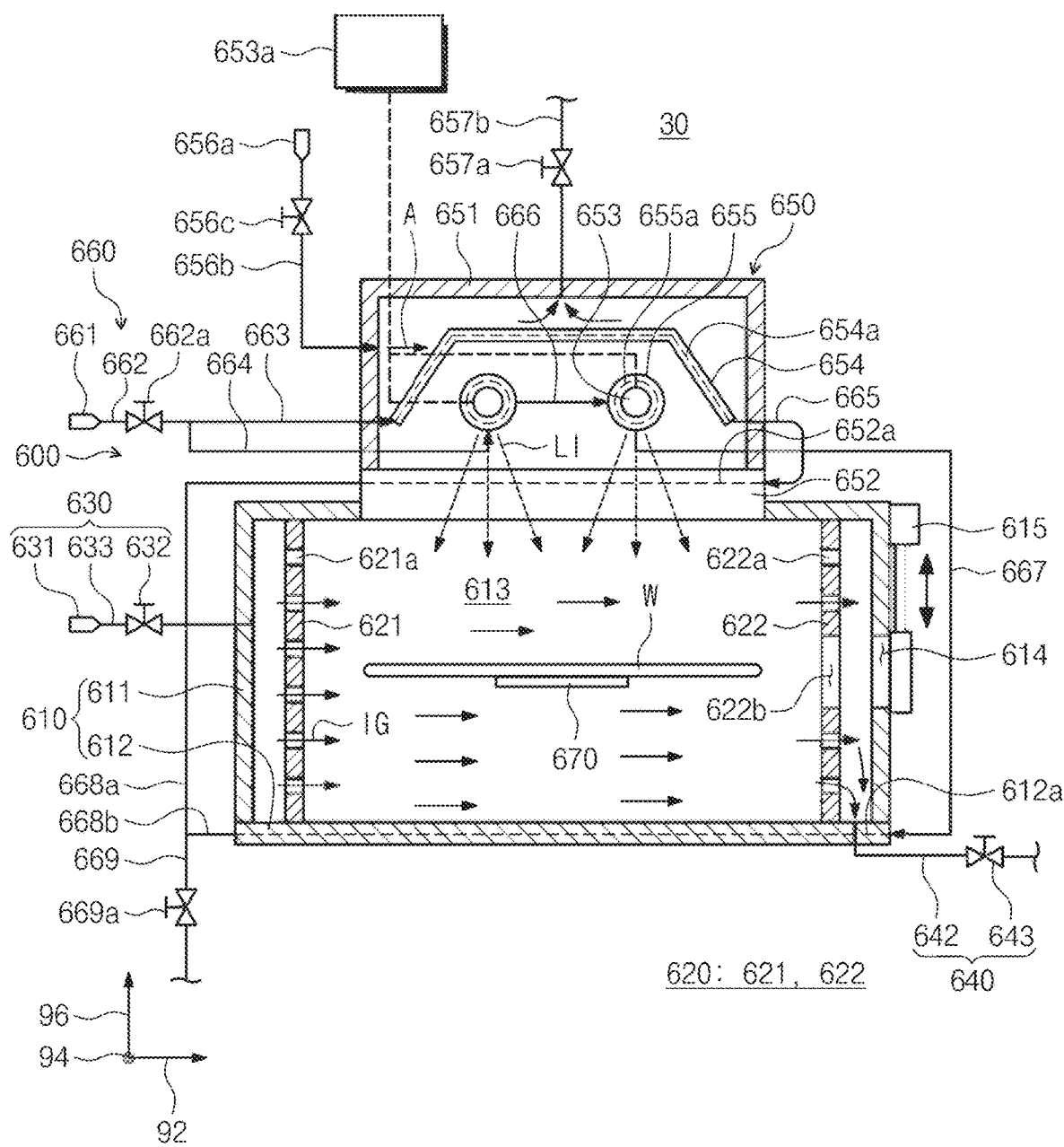
FIG. 9 is a diagram illustrating a view of the substrate treatment apparatus performing the light treatment operation of FIG. 6.

FIG. 9 is a diagram illustrating a view of the substrate treatment apparatus performing the light treatment operation of FIG. 6.

Referring to FIGS. 6 and 9, the light treatment operation S30 may be performed after the drying operation S20 is performed. The substrate W dried in the drying chamber 500 may be loaded into the light treatment chamber 600. The light source 653 in the light treatment chamber 600 may generate light LI. The light LI in a set range of wavelengths may be selected by the light source tube 655, which may be a light filter. The light LI selected with the set range of wavelength may be transmitted to the substrate W. The set range of wavelength may be wavelengths in the visible light range. For example, the set range of wavelength may be wavelengths in the range of 350 to 700 nm. When the light LI is transmitted to the substrate W, the organic matter adhering to the substrate W may be thermally degraded. The thermally degraded organic matter may be sublimated or vaporized into the treatment space 613. The sublimated or vaporized organic matter may be discharged to the outside via the gas exhaust unit 640 in an air current generated by the gas supplied by the gas supply unit 630.

Figure 10:
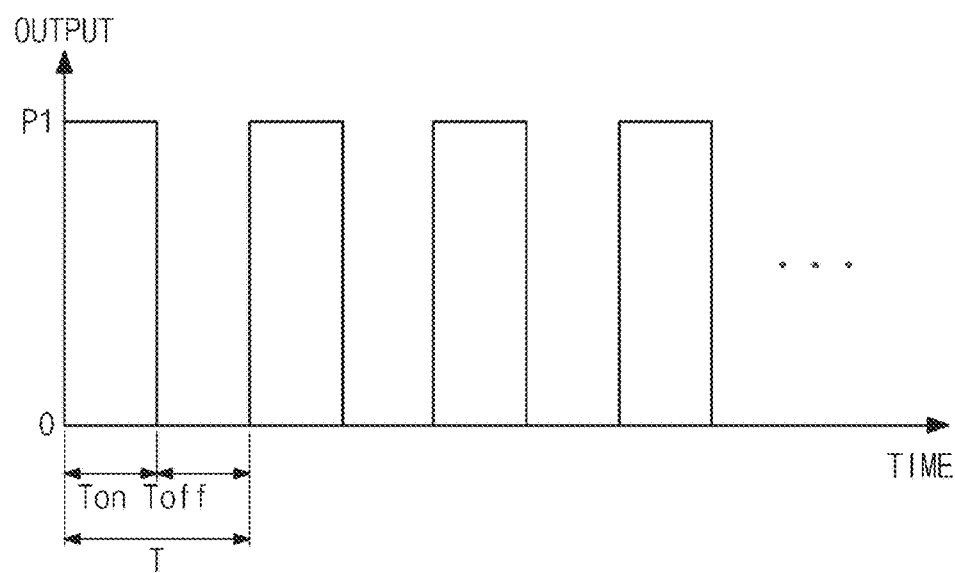
FIG. 10 is a graph illustrating an example of a change in output of light over time when performing the light treatment operation of FIG. 9.

FIG. 10 is a graph illustrating an example of a change in output of light over time when performing the light treatment operation of FIG. 9.

Referring to FIGS. 9 and 10, the light LI emitted by the light source 653 may be in the form of pulses. The on state and the off state of the light source 653 may be repeated periodically, and the on state and the off state corresponding to one period may be defined as a unit pulse. In addition, for the pulse form, the light source 653 may periodically repeat a high state and a low state, where one period of high and low states may be defined as a unit pulse. When the light LI is emitted in the form of a pulse, it may mean that the unit pulse is repeated at least once (for example, multiple times).

The on state of the light source 653 may mean a state in which the light L1 is output, the off state may mean a state in which the light L1 is not output (output is zero), a high state of the light source 653 may mean a state in which the light L1 is output but the output value is large, and a low state of the light source 6553 may mean a state in which the light L1 is output but the output value is smaller than the high state.

As discussed above, when the light source 653 emits the light in the form of a pulse, the light source 653 may have a higher output peak of the light LI, assuming that the light source 653 consumes the same power, which has the advantage of effectively removing the organic matter on the substrate W.

Further, the light source controller 653a may be configured to control a duty ratio in a unit pulse of light generated by the light source 653. The duty ratio may refer to the rate at which the light source 653 maintains an on or high state per one period T. For example, the duty ratio may be defined as Ton/T.

Further, the light source controller 653a may adjust the length of the period T of the unit pulse of the light LI generated by the light source 653. For example, the light source controller 653a may shorten or lengthen the period T.

Additionally, the light source controller 653a may increase or decrease the output of the light LI generated by the light source 653.

FIG. 10 shows an example in which the substrate W is light-treated by setting the output of the light LI in the on state to a first output P1, a duty ratio to 50%, and the period to T.

Figure 11:
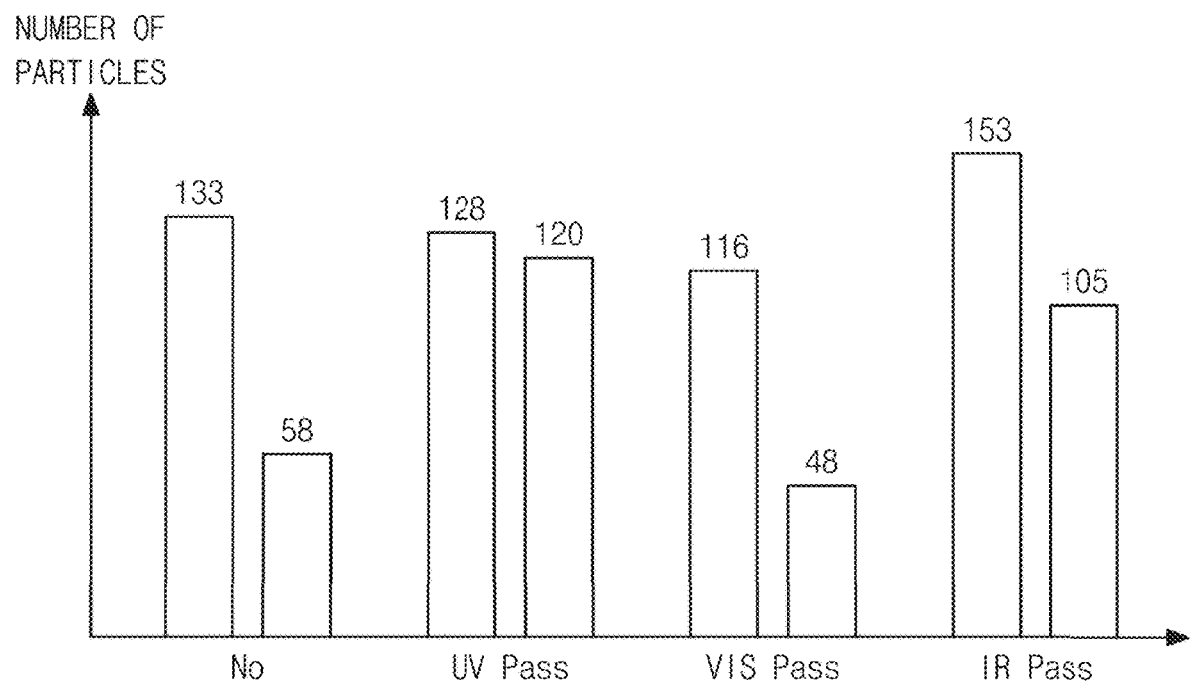
FIG. 11 is a graph illustrating particle removal efficiency according to a range of wavelengths passing through a light filter.

FIG. 11 is a graph illustrating particle removal efficiency according to a range of wavelengths passing through a light filter.

FIG. 11 shows the results of an organic matter (particle) removal experiment on the substrate W in the case [No] where no light filter is used, the case [UV Pass] where the light filter allows the wavelengths in the ultraviolet range to pass, the case [VIS Pass] where the light filter allows the wavelengths in the visible light range to pass, and the case [IR Pass] where the light filter allows the wavelengths in the infrared range to pass, in which a xenon flash lamp as described above is used as the light source 653. In each case, the left side shows the number of particles before light treatment and the right side shows the number of particles after light treatment.

Referring to FIG. 11, it can be seen that the best organic removal efficiency is achieved when no light filter is used (when the substrate is irradiated with the light LI in the full wavelength range) and when the light filter allows the wavelengths in the visible light range to pass through (when the substrate is irradiated with the light LI in the visible wavelength range). When the substrate was irradiated with the light LI of all wavelengths, the organic matter removal efficiency was 43.6%, and when the substrate was irradiated with the light LI of the wavelengths in the visible light range, the organic matter removal efficiency was 41.4%.

However, when the light filter is applied, the case where the light filter allows the wavelengths in the visible light range to pass through (when the light LI of the wavelength in the visible light range is emitted to the substrate) may be most efficient to remove the organic matter.

Specifically, when a light filter is not used (when the light LI of all wavelengths is emitted to the substrate), the temperature of the substrate W rises to the level of 350° C. In this case, the substrate W may be warped or the substrate may be broken due to thermal deformation and the like. The inventor has confirmed through long experiments that such an increase in temperature of the substrate W is caused by the wavelengths in the infrared range.

On the other hand, when the light filter that allows the wavelengths in the visible light range to pass through is used (when the substrate is irradiated with the light LI of the wavelengths in the visible light range), the temperature of the substrate W rises only to the level of 280° C. In this case, it is possible to minimize the occurrence of the warpage phenomenon or the broken phenomenon of the substrate described above.

In short, the present invention has the advantage of increasing organic matter removal efficiency by emitting the light LI in the form of pulses, and maintaining organic matter removal efficiency for the substrate W while preventing the temperature of the substrate W from increasing excessively.

Figure 12:
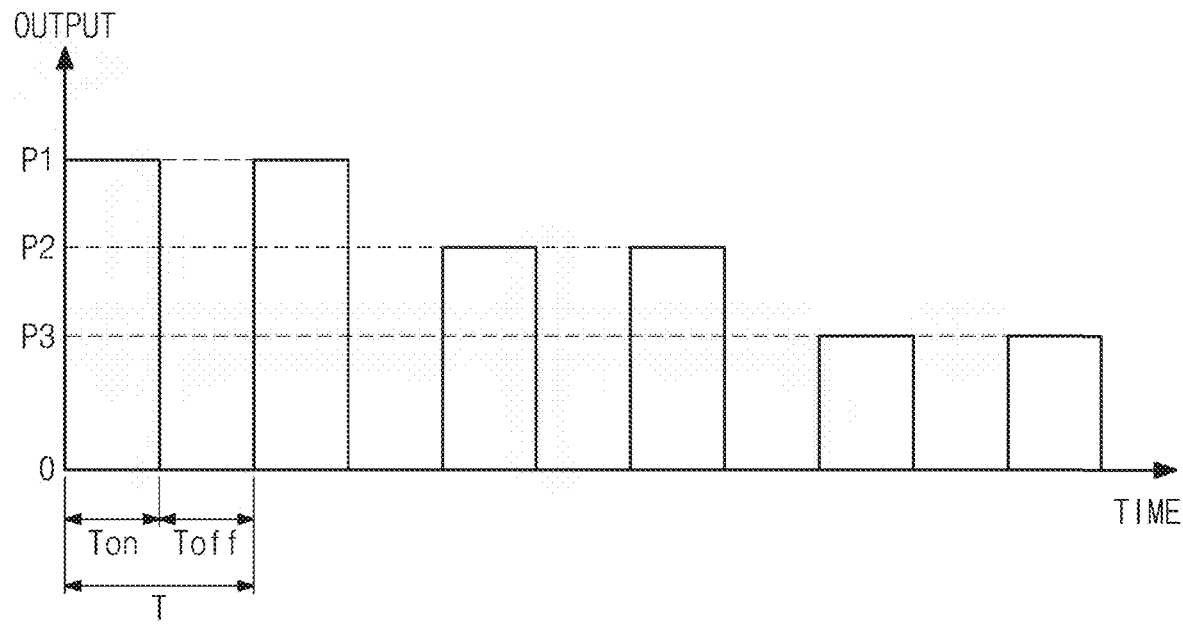
FIG. 12 is a graph illustrating another example of a change in output of light over time when performing the light treatment operation of FIG. 9.

FIG. 12 is a graph illustrating another example of a change in output of light over time when performing the light treatment operation of FIG. 9.

Referring to FIGS. 6, 8, and 12, the light source controller 653a of the present invention may control the light source 653 such that the output gradually decreases from a first output P1, to a second output P2, and to a third output P3, in the on state or high state of the unit pulse of the light LI during the light treatment of the substrate W. When the substrate W is repeatedly irradiated with the light LI, thermal energy may be accumulated in the substrate W. This may cause the temperature of the substrate W to increase excessively. Furthermore, when the light treatment of the substrate W is completed, the substrate W is cooled in the cooling chamber 800, and when the temperature of the substrate W changes too rapidly during the cooling process, the substrate W may be warped or broken. Accordingly, the present invention may solve the above problem by making the output gradually smaller from the first output P1 to the second output P2, and to the third output P3 in the on or high state of the unit pulse of the light LI during the light treatment of the substrate W.

Figure 13:
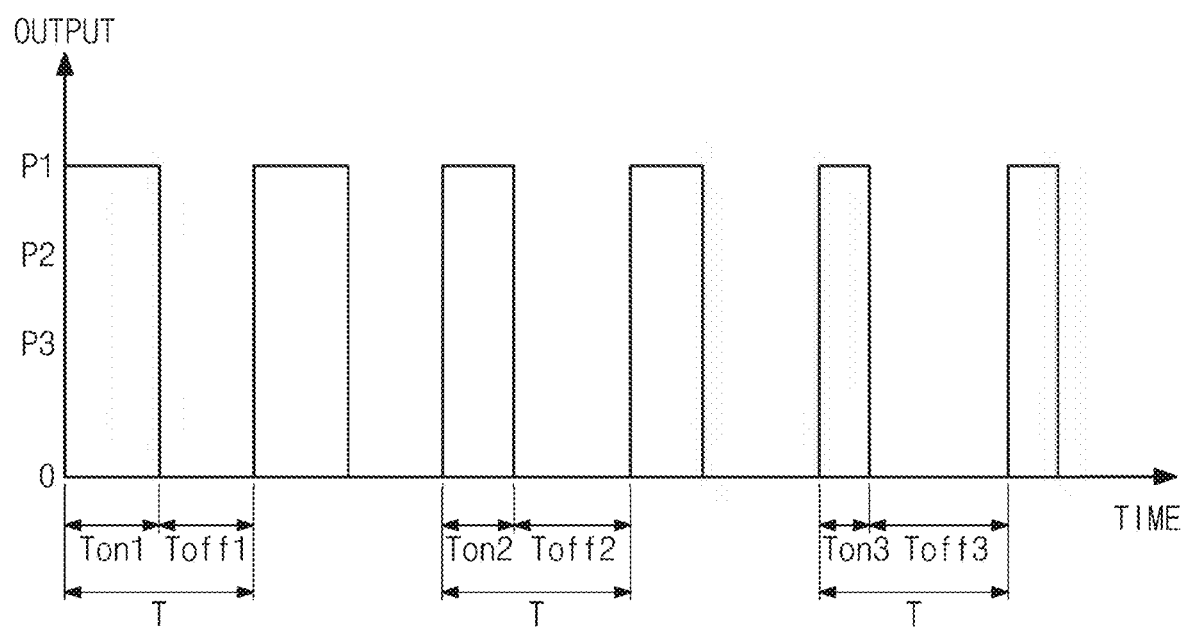
FIG. 13 is a graph illustrating another example of a change in output of light over time when performing the light treatment operation of FIG. 9.

FIG. 13 is a graph illustrating another example of a change in output of light over time when performing the light treatment operation of FIG. 9.

Referring to FIGS. 6, 8, and 13, the light source controller 653a of the present invention may control the light source 653 to gradually decrease the on-duty ratio of the unit pulse of the light LI during the light treatment of the substrate W. For example, the on-duty ratio may gradually decrease from a level of Ton1/T=50%, to a level of Ton2/T=40%, and then to a level of Ton3/T=30% (in FIGS. 13, Ton1, Ton2, and Ton3 are shown as being repeated once each for ease of description, but Ton1, Ton2, and Ton3 may each be repeated a plurality of times). In this case, it is also advantageous to minimize an excessive increase in the temperature of the substrate W and a sudden change in the temperature of the substrate W.

Figure 14:
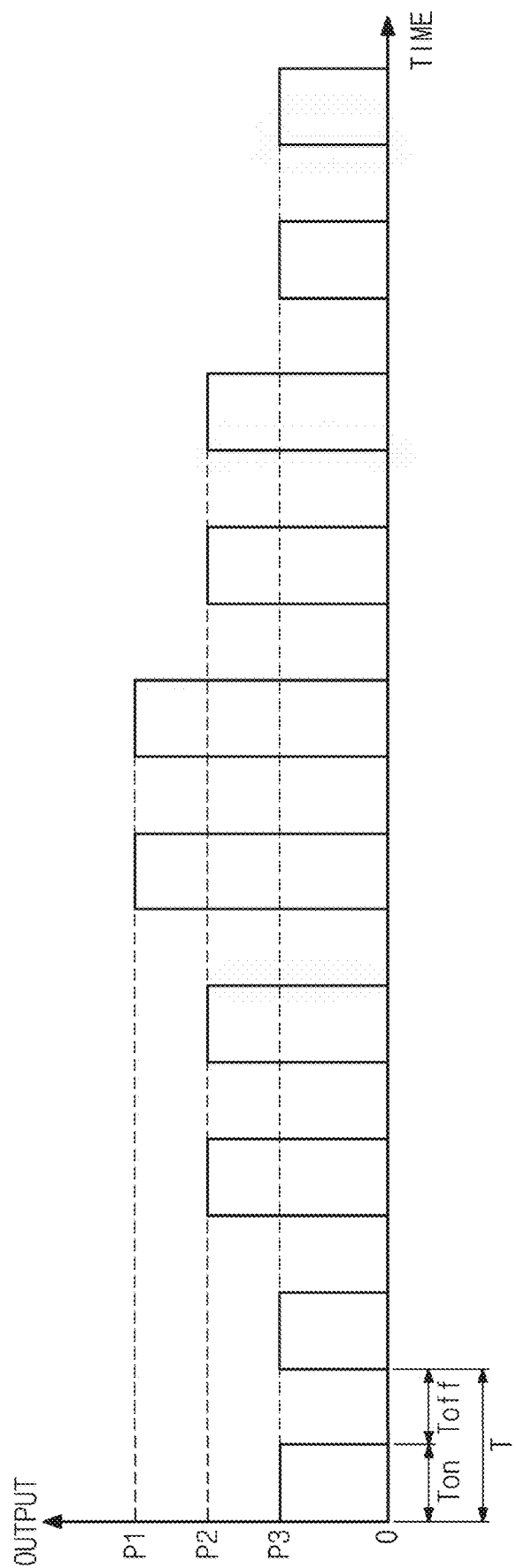
FIG. 14 is a graph illustrating another example of a change in output of light over time when performing the light treatment operation of FIG. 9.

FIG. 14 is a graph illustrating another example of a change in output of light over time when performing the light treatment operation of FIG. 9.

Referring to FIGS. 6, 8, and 14, the output of the light LI may gradually increase from the third output P3 to the second output P2, and to the first output P1, and then gradually decrease to the third output P3. The temperature of the substrate W may drop during the transfer process. In this case, by slowly increasing the temperature of the substrate W, the rapid change in the temperature of the substrate W while light-treating the substrate W may be minimized.

Figure 15:
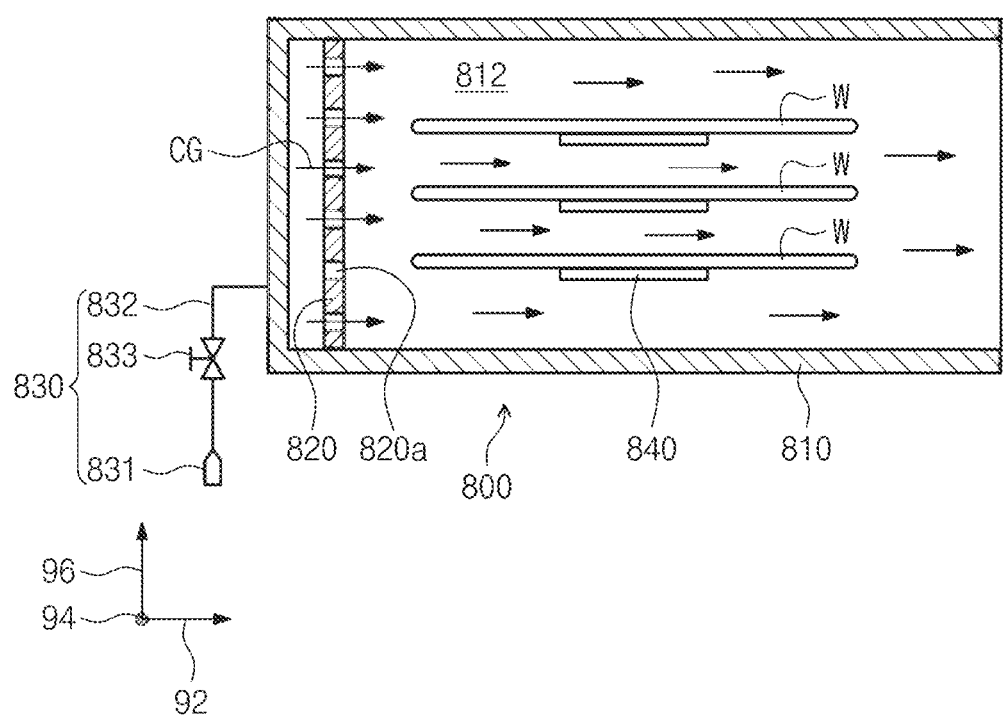
FIG. 15 is a diagram illustrating a view of the substrate processing apparatus performing a cooling operation of FIG. 6.

FIG. 15 is a diagram illustrating a view of the substrate processing apparatus performing the cooling operation of FIG. 6.

Referring to FIGS. 6 and 15, in the cooling operation S40, the light-treated substrates W may be supported on the support shelves 840 in the cooling chamber 800, and the cooling gas supply unit 830 may supply cooling gas CG to cool the substrate W. The temperature of the cooling gas CG may be at room temperature, or may be controlled and supplied at a lower temperature.

Figure 16:
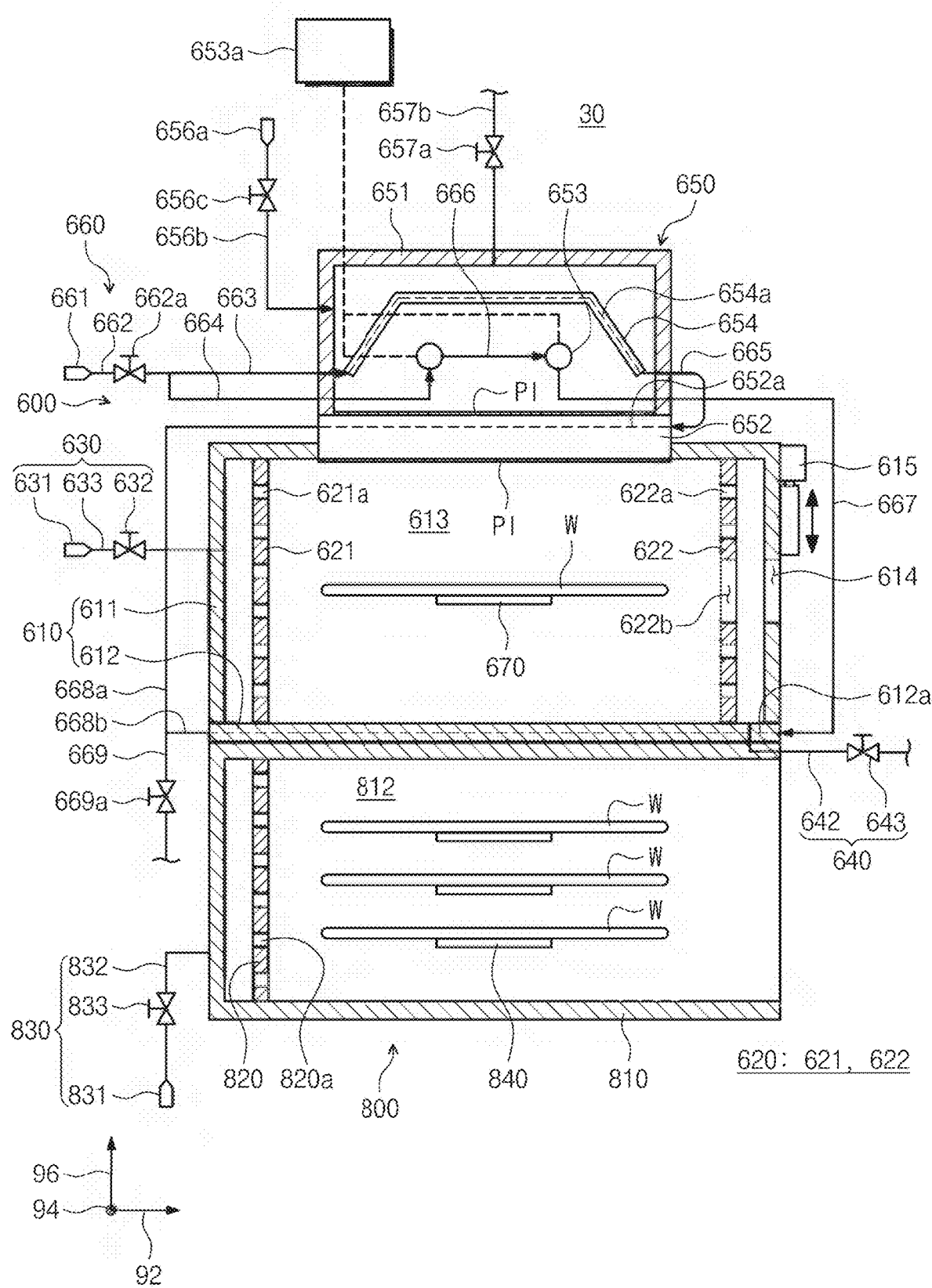
FIG. 16 is a perspective view schematically illustrating another example of a second treatment module of FIG. 1.

In the examples described above, the case where the light filter is the light source tube 655 has been described as an example, but the present invention is not limited thereto. For example, as illustrated in FIG. 16, the light filter may be the middle plate 652. In this case, the middle plate 652 may have a film PI attached that filters out wavelengths other than the visible light range from the light. Alternatively, the middle plate 652 may have a coating layer formed that filters out wavelengths other than the visible light range from the light.

In the examples described above, the case where the light filter is the light source tube 655 or the middle plate 652 has been described as an example, but the present invention is not limited thereto. The light filter may also refer to a film or a coating layer that is attached to the light source tube 655 or the middle plate 652.

Figure 17:
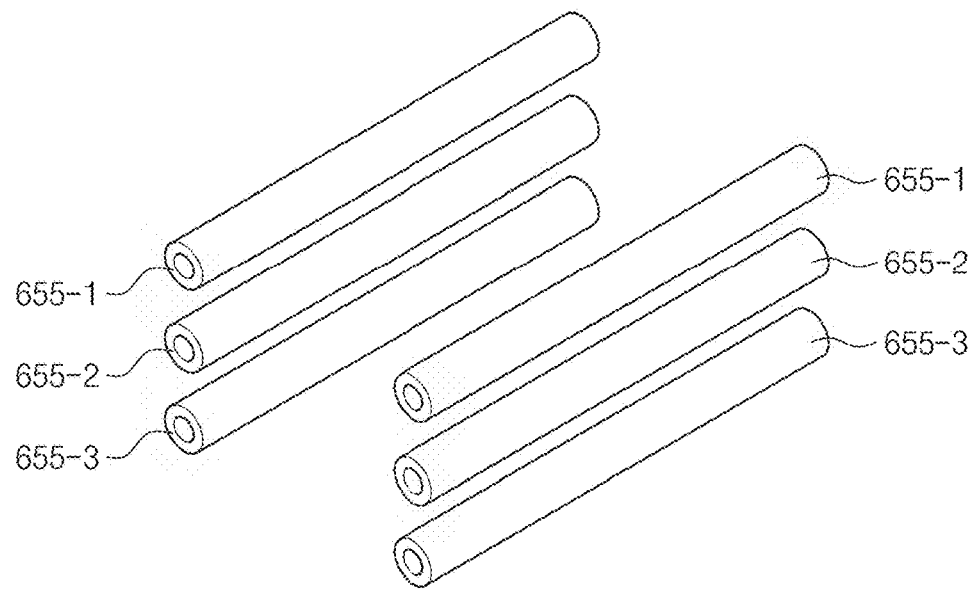
FIG. 17 is a diagram illustrating a view of light source tubes that may be applied to a light irradiation unit of the present invention.

FIG. 17 is a diagram illustrating a view of light source tubes that may be applied to the light irradiation unit of the present invention. A user may have the light source tubes 655 that are light filters that selectively allow different ranges of wavelengths to pass through. For example, a first light source tube 655-1 may selectively allow wavelengths in the visible light range to pass through, a second light source tube 655-2 may selectively allow wavelengths in the infrared range to pass through, and a third light source tube 655-3 may selectively allow wavelengths in the ultraviolet range to pass through. The user may install any one selected from the light source tubes 655 in the light irradiation unit 650 to process the substrate W, depending on the type of organic matter remaining on the substrate W.

Figure 18:
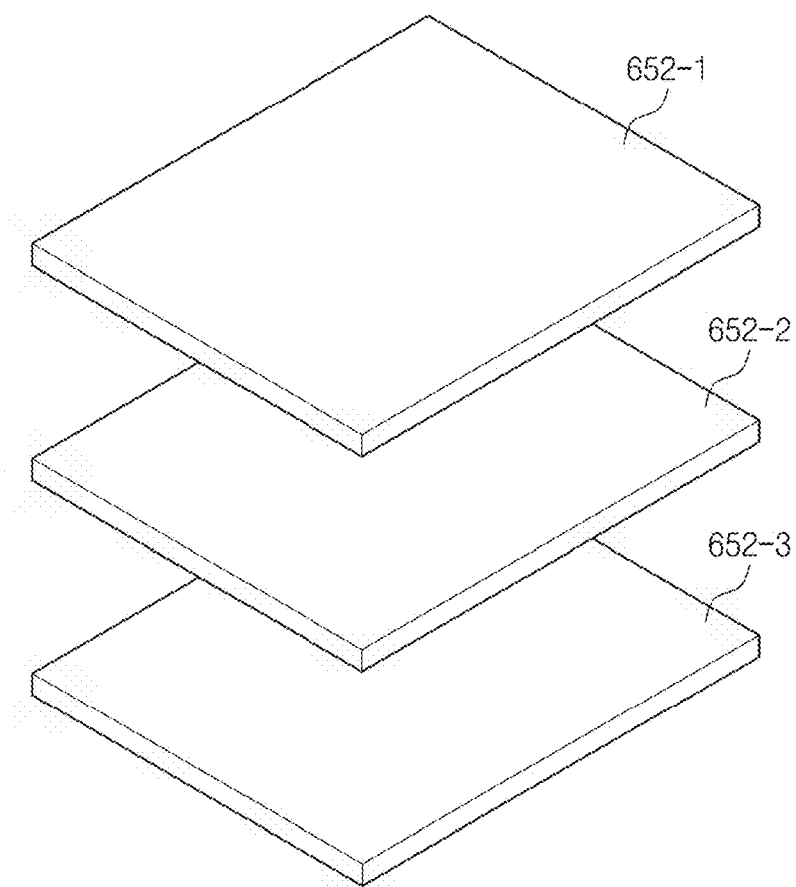
FIG. 18 is a diagram illustrating middle plates that may be applied to the light irradiation unit of the present invention.

Similarly, as illustrated in FIG. 18, a user may have the middle plates 652 that are light filters that selectively allow different ranges of wavelengths to pass through. For example, a first middle plate 655-1 may selectively allow wavelengths in the visible light range to pass through, a second middle plate 655-2 may selectively allow wavelengths in the infrared range to pass through, and a third middle plate 655-3 may selectively allow wavelengths in the ultraviolet range to pass through. A user may install any one selected from the middle plates 652 in the light irradiation unit 650 to process the substrate W, depending on the type of organic matter remaining on the substrate W.

Figure 19:
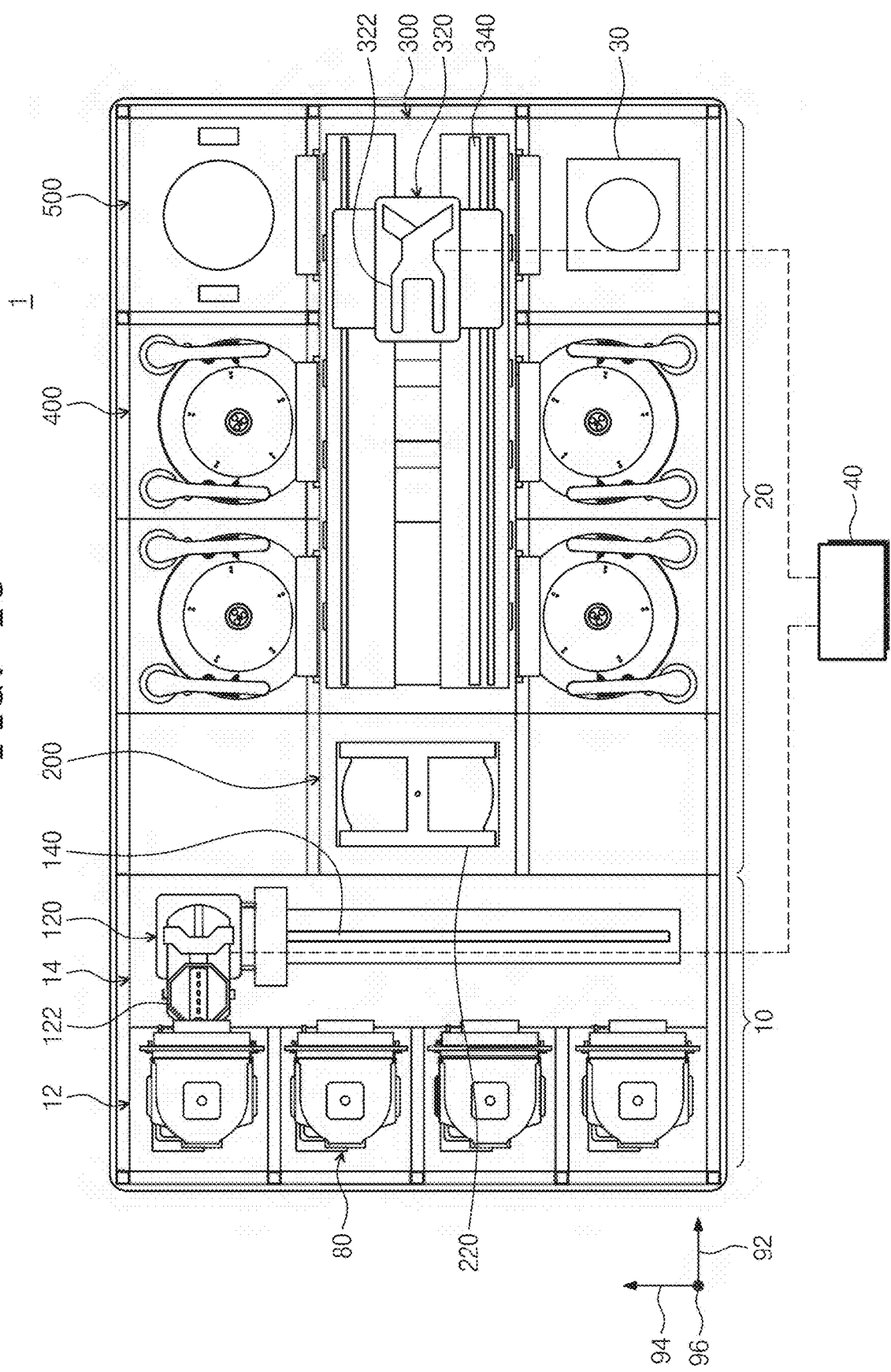
FIG. 19 is a top plan view schematically illustrating a substrate processing apparatus according to another exemplary embodiment of the present invention.
Figure 20:
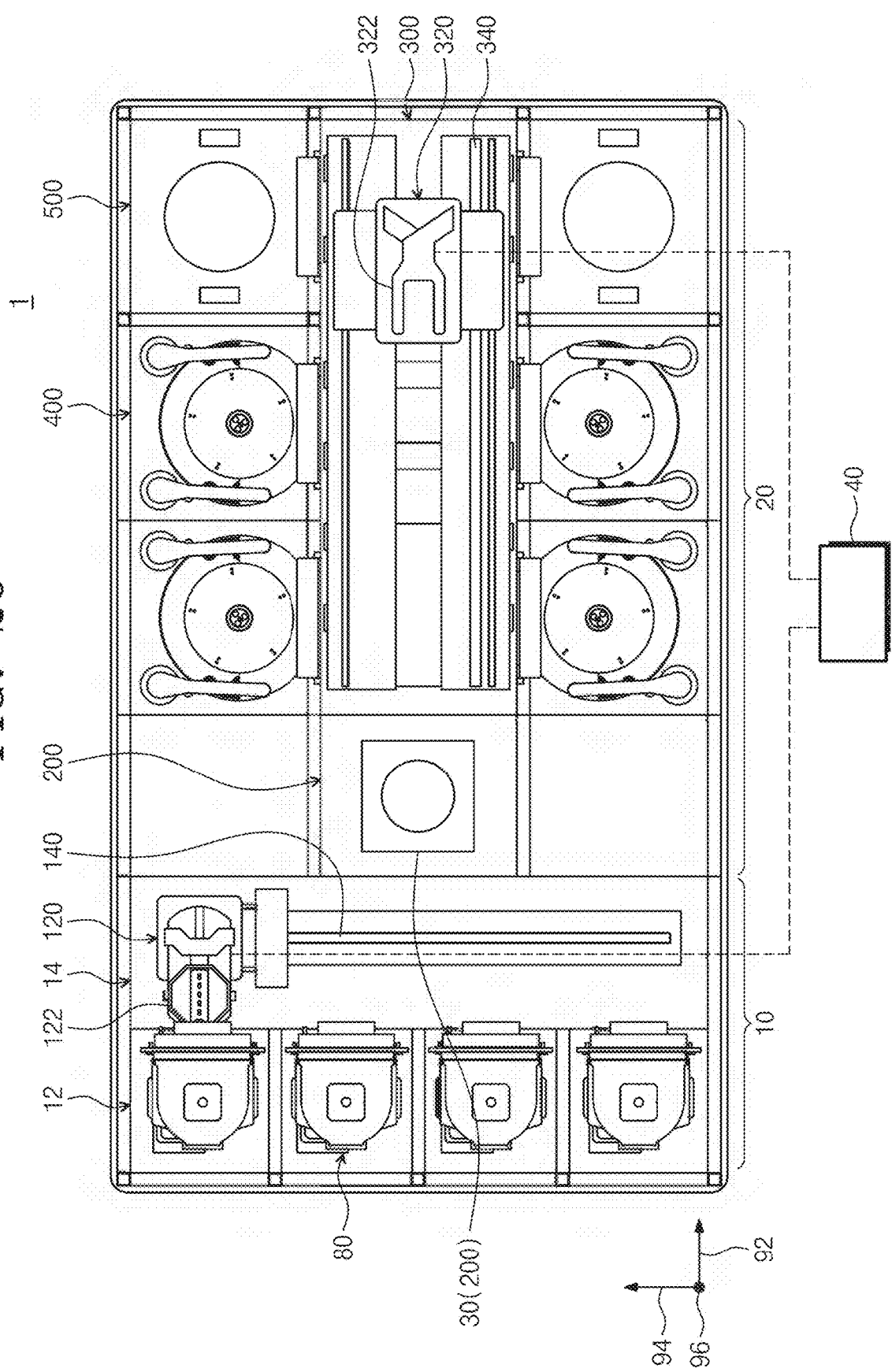
FIG. 20 is a top plan view schematically illustrating a substrate processing apparatus according to another exemplary embodiment of the present invention.

In the above example, the second treatment module 30 is shown to be installed at a location adjacent to the index frame 14. Alternatively, however, the second treatment module 30 may be disposed within the first treatment module 20, as illustrated in FIG. 19. Optionally, the second treatment module 30 may be stacked with the buffer unit 200, as illustrated in FIG. 20.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. An apparatus for processing a substrate, the apparatus comprising:
a liquid treatment chamber configured to liquid-treat a substrate by supplying a treatment liquid to the substrate;
a drying chamber configured to dry treat the substrate treated in the liquid treatment chamber; and
a light treatment chamber configured to irradiate the substrate treated in the drying chamber with light to remove an organic matter residual on the substrate,
wherein the light treatment chamber includes:
a treatment housing having a treatment space in which the substrate is processed;
a support member for supporting the substrate in the treatment space;
a light source configured to irradiate the substrate supported on the support member with light in pulses, the light source configured to generate wavelengths of light in a range of 300 nm to 1,000 nm; and
a light filter for selecting a set range of selected wavelengths of the light generated by the light source and allowing the selected wavelengths to pass through,
wherein the light filter is configured to filter wavelengths of light other than the selected wavelengths of light generated by the light source and the selected wavelengths are 350 nm to 700 nm.

2. The apparatus of claim 1, wherein the light filter has a tube shape surrounding the light source.

3. The apparatus of claim 2, wherein the light filter is formed from a material including quartz, and a film that filters wavelengths other than the selected wavelengths is attached to a surface of the light filter, or a coating layer is formed on the surface of the light filter.

4. The apparatus of claim 1, wherein the light treatment chamber includes: a light source housing that defines a space in which the light source is placed, and
the light filter is disposed between the light source housing and the treatment housing, and
the light filter has a plate shape to compartmentalize the treatment space of the treatment housing and the space of the light source housing from each other, and a film that filters the wavelengths other than the selected wavelengths is attached to a surface of the light filter or a coating layer is formed on the surface of the light filter.

5. The apparatus of claim 1, wherein the light source is a xenon flash lamp.

6. The apparatus of claim 1, further comprising:
a light source controller for controlling an operation of the light source,
wherein the light source controller is configured to control at least one of an output of the light generated by the light source, a duty ratio in a unit pulse of light, and a period of the unit pulse of light.

7. The apparatus of claim 6, wherein the light source controller controls the light source such that an output of the unit pulse of the light generated by the light source in an on state or a high state is constant during light treatment of the substrate supported on the support member.

8. The apparatus of claim 6, wherein the light source controller controls the light source such that an output of the unit pulse of the light generated by the light source in an on state or a high state becomes gradually smaller during light treatment of the substrate supported on the support member.

9. The apparatus of claim 6, wherein the light source controller controls the light source such that the duty ratio of the unit pulse of the light generated by the light source varies during light treatment of the substrate supported on the support member.

10. The apparatus of claim 9, wherein the light source controller controls the light source such that the duty ratio of the unit pulse of the light generated by the light source becomes gradually smaller during light treatment of the substrate supported on the support member.

11. An apparatus for processing a substrate, the apparatus comprising:
a liquid treatment chamber for liquid-treating a substrate by supplying an organic solvent to the substrate;
a drying chamber for drying the substrate by supplying a supercritical fluid to the substrate treated in the liquid treatment chamber; and
a light treatment chamber for irradiating the substrate treated in the drying chamber with light to remove an organic matter residual on the substrate,
wherein the light treatment chamber includes:
a treatment housing having a treatment space in which the substrate is processed;
a support member for supporting the substrate in the treatment space; and
a light irradiation unit located on an upper side of the treatment housing and for irradiating the substrate supported on the support member with light, and
the light irradiation unit includes:
a xenon flash lamp for irradiating the substrate supported on the support member with light in pulses, in which the xenon flash lamp is configured to generate light having wavelengths in a range of 300 to 1000 nm;
a light source housing providing a space in which the xenon flash lamp is installed;
a light filter configured to select wavelengths in the visible light range in the wavelengths of the light generated by the xenon flash lamp and allows the selected wavelengths to pass through, the light filter is configured to filter wavelengths of light other than the selected wavelengths of light generated by the light source and the selected wavelengths of light are 350 nm to 700 nm;
a reflective member installed on a top side of the xenon flash lamp, and for reflecting light generated by the xenon flash lamp toward the substrate;
a middle plate disposed between the light source housing and the treatment housing, and having a middle plate refrigerant flow path formed therein; and
a refrigerant supply unit for supplying a refrigerant, and the refrigerant supply unit includes:
a refrigerant supply source for supplying the refrigerant;
a first supply line for supplying the refrigerant from the refrigerant supply source to a reflective member refrigerant flow path formed in the reflective member; and
a first delivery line for delivering the refrigerant from the reflective member refrigerant flow path to the middle plate refrigerant flow path.

12. An apparatus for processing a substrate, the apparatus comprising:

a liquid treatment chamber for liquid-treating a substrate by supplying an organic solvent to the substrate;

a drying chamber for drying the substrate by supplying a supercritical fluid to the substrate treated in the liquid treatment chamber; and a light treatment chamber for irradiating the substrate treated in the drying chamber with light to remove an organic matter residual on the substrate, wherein the light treatment chamber includes:

a treatment housing having a treatment space in which the substrate is processed;

a support member for supporting the substrate in the treatment space; and a light irradiation unit located on an upper side of the treatment housing and for irradiating the substrate supported on the support member with light, and the light irradiation unit includes:

a xenon flash lamp for irradiating the substrate supported on the support member with light in pulses, in which the xenon flash lamp is configured to generate light having wavelengths in a range of 300 to 1000 nm;

a light source housing providing a space in which the xenon flash lamp is installed;

a light filter configured to select wavelengths in the visible light range in the wavelengths of the light generated by the xenon flash lamp and allows the selected wavelengths to pass through;

a reflective member installed on a top side of the xenon flash lamp, and for reflecting light generated by the xenon flash lamp toward the substrate;

a middle plate disposed between the light source housing and the treatment housing, and having a middle plate refrigerant flow path formed therein; and a refrigerant supply unit for supplying a refrigerant, and the refrigerant supply unit includes:

a refrigerant supply source for supplying the refrigerant;

a first supply line for supplying the refrigerant from the refrigerant supply source to a reflective member refrigerant flow path formed in the reflective member; and a first delivery line for delivering the refrigerant from the reflective member refrigerant flow path to the middle plate refrigerant flow path wherein the light irradiation unit further includes a light source tube in a shape of a tube surrounding the xenon flash lamp, a light source tube refrigerant flow path is formed within the light source tube, and the refrigerant supply unit includes:

a second supply line for supplying the refrigerant from the refrigerant supply source to the light source tube refrigerant flow path; and a third delivery line for delivering the refrigerant from the light source tube refrigerant flow path to a cooling plate refrigerant flow path of a cooling plate, in which the cooling plate is included in the treatment housing and located on a lower side of the support member.

* * * * *